US012755389B2

(12) United States Patent
Torras et al.

(10) Patent No.: US 12,755,389 B2
(45) Date of Patent: Oct. 6, 2026

(54) SYSTEMS AND METHODS FOR AUTOMATED STRUCTURE MODELING FROM DIGITAL IMAGERY

(71) Applicant: Pictometry International Corp., Rochester, NY (US)

(72) Inventors: Oriol Caudevilla Torras, Seattle, WA (US); David Murr, Minneapolis, MN (US); Shadrian Strong, Bellevue, WA (US)

(73) Assignee: Pictometry International Corp., Rochester, NY (US)

( * ) Notice: Subject to any disclaimer, the term of this patent is extended or adjusted under 35 U.S.C. 154(b) by 1023 days.

(21) Appl. No.: 18/047,948

(22) Filed: Oct. 19, 2022

(65) Prior Publication Data

US 2023/0070615 A1 Mar. 9, 2023

Related U.S. Application Data

(63) Continuation of application No. PCT/US2021/028687, filed on Apr. 22, 2021.

(Continued)

(51) Int. Cl.

*G06T 7/11* (2017.01)
*G06F 30/13* (2020.01)

(Continued)

(52) U.S. Cl.

CPC ................ *G06T 7/11* (2017.01); *G06F 30/13* (2020.01); *G06T 7/73* (2017.01); *G06V 20/17* (2022.01);

(Continued)

(58) Field of Classification Search

None

See application file for complete search history.

(56) References Cited

U.S. PATENT DOCUMENTS 10,860,919 B2 * 12/2020 Kanazawa ................ G06T 7/12
11,393,100 B2 * 7/2022 Zhang ....................... G06T 3/40

(Continued)

OTHER PUBLICATIONS

International Searching Authority, Notification of Transmittal of the International Search Report and the Written Opinion (PCT/US21/28687), dated Jul. 15, 2021, 8 pages.

(Continued)

*Primary Examiner* — Paul S Schwarzenberg
(74) *Attorney, Agent, or Firm* — DUNLAP CODDING. P.C.

(57) ABSTRACT

Methods and systems for automated structure modeling form digital imagery are disclosed, including a method comprising receiving target digital images depicting a target structure; automatically identifying target elements of the target structure in the target digital images using convolutional neural network semantic segmentation; automatically generating a heat map model depicting a likelihood of a location of the target elements of the target structure; automatically generating a two-dimensional model or a three-dimensional model of the target structure based on the heat map model without further utilizing the target digital images; and extracting information regarding the target elements from the two-dimensional or the three-dimensional model of the target structure.

19 Claims, 15 Drawing Sheets

Related U.S. Application Data

(60) Provisional application No. 63/014,263, filed on Apr. 23, 2020.

(51) Int. Cl.
*G06T 7/73* (2017.01)
*G06V 20/17* (2022.01)
*G06V 20/70* (2022.01)

(52) U.S. Cl.
CPC .......... *G06V 20/70* (2022.01); *G06T 2200/08* (2013.01); *G06T 2207/10032* (2013.01); *G06T 2207/20021* (2013.01)

(56) References Cited

U.S. PATENT DOCUMENTS

| | | | | |
|---|---|---|---|---|
| 11,610,390 | B2 * | 3/2023 | Tsai | G06N 3/063 |
| 12,367,586 | B2 * | 7/2025 | Lin | G06V 10/248 |
| 2015/0234864 | A1 * | 8/2015 | Kruckemeier | G06F 16/951<br>707/725 |
| 2017/0041407 | A1 * | 2/2017 | Wilbur | G06Q 50/02 |
| 2017/0076438 | A1 * | 3/2017 | Kottenstette | H04N 23/10 |
| 2019/0199941 | A1 * | 6/2019 | Mitsui | H04N 5/272 |
| 2024/0070894 | A1 * | 2/2024 | Tanaka | G06T 7/246 |

OTHER PUBLICATIONS

Zhao et al., "Pyramid Scene Parsing Network", 2017 IEEE Conference on Computer Vision and Pattern Recognition (CVPR) (2016): 6230-6239.
Krizhevsky et al., "ImageNet Classification with Deep Convolutional Neural Networks," Advances in Neural Information Processing Systems 25, pp. 1097-1105, 2012.
Long et al., "Fully Convolutional Networks for Semantic Segmentation," IEEE Conference on Computer Vision and Pattern Recognition, Jun. 2015.
Gioi et al., "LSD: a Line Segment Detector", Image Processing on Line, 2 (2012), pp. 35-55.
Baillard et al., Automatic line matching and 3D reconstruction of buildings from multiple views; ISPRS Conference on Automatic Extraction of GIS Objects from Digital Imagery, Sep. 1999, Munich, Germany. pp.69-80. inria-00590111.
Lopez et al., On Computing Connected Components of Line Segments, IEEE Transactions on Computers, vol. 44, No. 4, pp. 597-601, Apr. 1995.

* cited by examiner

SYSTEMS AND METHODS FOR AUTOMATED STRUCTURE MODELING FROM DIGITAL IMAGERY

CROSS-REFERENCE TO RELATED APPLICATIONS

This application is a continuation of the PCT Application identified as Serial Number PCT/US2021/028687, filed on Apr. 22, 2021, which published as Publication Number WO2021/216904A1, titled "SYSTEMS AND METHODS FOR AUTOMATED STRUCTURE MODELING FROM DIGITAL IMAGERY", which claims priority to the provisional patent application identified by U.S. Ser. No. 63/014,263, filed Apr. 23, 2020, titled "SYSTEMS AND METHODS FOR AUTOMATED STRUCTURE MODELING FROM DIGITAL IMAGERY", the entire contents of each of which are hereby expressly incorporated herein by reference.

BACKGROUND

Traditionally, the standard practice for extracting 3D wireframes from imagery requires significant human interaction with little to no automation. For example, software utilized for creating three-dimensional architectural or engineering wireframes of objects may include solid model drawing software systems like AutoDesk's Computer Aided Design (CAD) software produced by Autodesk, Inc., having a corporate headquarters at 111 McInnis Parkway, San Rafael, CA 94903, USA (www.autodesk.com/solutions/cad-software), The Computational Geometry Algorithms Library (CGAL) by The GCAL Project (www.cgal.org), or BRL-CAD open source software (brlcad.org). Traditional modeling software systems require significant human decisions and interaction, as well as agnosticism and/or ignorance to building or structure specific realism or accuracy, and the lack of ability to utilize imagery as a foundational measurement element. Standard modeling software systems rely on humans to manually extract at least some features and connect the features.

Identifying structural features of a building, such as roof pitch measurement (an angular inclination of a roof surface relative to a horizontal plane) and eave height (a vertical distance from the ground to the lowest edge of the roof line), is typically performed either manually by a person on site at the building using a level, tape measure, or other manual tools, or is performed manually or at least partially manually using photogrammetry.

In manual photogrammetry, a human identifies key points of the roof and ground in multiple images. Then, the manually-acquired information is combined with the camera projection (elevation and orientation) information to estimate the location of the points in a space and compute measurements, such as the eave height and roof pitch measurements.

Another previous approach uses the registration of multiple images to three-dimensional grids by an operator manually choosing matching points in multiple images, which in some instances may be combined with camera meta-data, to create three-dimensional models of structures from which measurements can be extracted.

Additionally, another previous approach utilizes dense point clouds to determine roof pitch and other measurements of a roof of a building. Though this approach is semi-automated, it resulted in poor accuracy and had limited scalability. The use of dense point clouds also requires manual steps for feature matching and data cleaning.

However, these known techniques require significant manual effort, at the site of the building or through human interaction with the images or with point clouds.

Therefore, what is needed are automated systems and methods for extracting structure feature information and measurements from digital images depicting structures without manual intervention. Further, what is needed are automated systems and methods for extracting structure feature information and measurements from digital images depicting structures with the efficient use of computer resources and in a timely manner.

SUMMARY

The problems involved in determining feature information for structures are solved with the methods and systems described herein, including the automated extraction of feature information and measurements from digital images depicting structures.

BRIEF DESCRIPTION OF SEVERAL VIEWS OF THE DRAWINGS

The accompanying drawings, which are incorporated in and constitute a part of this specification, illustrate one or more implementations described herein and, together with the description, explain these implementations. The drawings are not intended to be drawn to scale, and certain features and certain views of the figures may be shown exaggerated, to scale or in schematic in the interest of clarity and conciseness. Not every component may be labeled in every drawing. Like reference numerals in the figures may represent and refer to the same or similar element or function. In the drawings.

DETAILED DESCRIPTION

Figure 1:
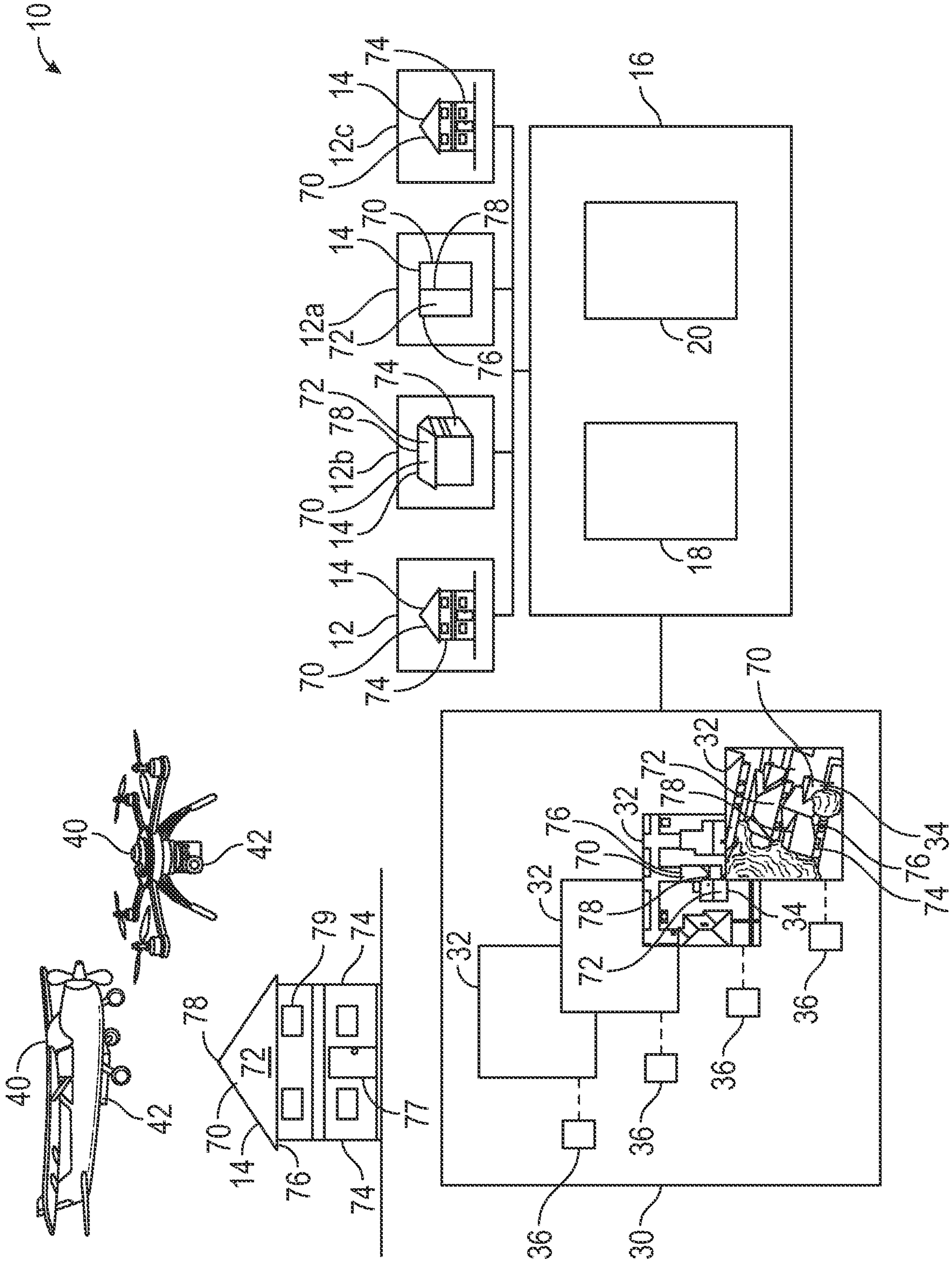
FIG. 1 is an exemplary automated digital-imagery structure modeling system in accordance with the present disclosure.

Before explaining at least one embodiment of the disclosure in detail, it is to be understood that the disclosure is not limited in its application to the details of construction, experiments, exemplary data, and/or the arrangement of the components set forth in the following description or illustrated in the drawings unless otherwise noted.

The disclosure is capable of other embodiments or of being practiced or carried out in various ways. For instance, although residential structures may be used as an example, the methods and systems may be used to automatically assess other man-made objects, non-exclusive examples of which include vehicles, commercial buildings and infrastructure including roads, bridges, utility lines, pipelines, utility towers. Also, it is to be understood that the phraseology and terminology employed herein is for purposes of description, and should not be regarded as limiting.

As used in the description herein, the terms "comprises," "comprising," "includes," "including," "has," "having," or any other variations thereof, are intended to cover a non-exclusive inclusion. For example, unless otherwise noted, a process, method, article, or apparatus that comprises a list of elements is not necessarily limited to only those elements, but may also include other elements not expressly listed or inherent to such process, method, article, or apparatus.

Further, unless expressly stated to the contrary, "or" refers to an inclusive and not to an exclusive "or". For example, a condition A or B is satisfied by one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more, and the singular also includes the plural unless it is obvious that it is meant otherwise. Further, use of the term "plurality" is meant to convey "more than one" unless expressly stated to the contrary.

As used herein, qualifiers like "substantially," "about," "approximately," and combinations and variations thereof, are intended to include not only the exact amount or value that they qualify, but also some slight deviations therefrom, which may be due to computing tolerances, computing error, manufacturing tolerances, measurement error, wear and tear, stresses exerted on various parts, and combinations thereof, for example.

As used herein, any reference to "one embodiment," "an embodiment," "some embodiments," "one example," "for example," or "an example" means that a particular element, feature, structure or characteristic described in connection with the embodiment is included in at least one embodiment and may be used in conjunction with other embodiments. The appearance of the phrase "in some embodiments" or "one example" in various places in the specification is not necessarily all referring to the same embodiment, for example.

The use of ordinal number terminology (i.e., "first", "second", "third", "fourth", etc.) is solely for the purpose of differentiating between two or more items and, unless explicitly stated otherwise, is not meant to imply any sequence or order or importance to one item over another or any order of addition.

The use of the term "at least one" or "one or more" will be understood to include one as well as any quantity more than one. In addition, the use of the phrase "at least one of X, V, and Z" will be understood to include X alone, V alone, and Z alone, as well as any combination of X, V, and Z.

Circuitry, as used herein, may be analog and/or digital components, or one or more suitably programmed processors (e.g., microprocessors) and associated hardware and software, or hardwired logic. Also, "components" may perform one or more functions. The term "component," may include hardware, such as a processor (e.g., microprocessor), an application specific integrated circuit (ASIC), field programmable gate array (FPGA), a combination of hardware and software, and/or the like. The term "processor" as used herein means a single processor or multiple processors working independently or together to collectively perform a task.

Software may include one or more computer readable instructions that when executed by one or more components cause the component to perform a specified function. It should be understood that the algorithms described herein may be stored on one or more non-transitory computer readable medium. Exemplary non-transitory computer readable mediums may include random access memory, read only memory, flash memory, and/or the like. Such non-transitory computer readable mediums may be electrically based, optically based, and/or the like.

Referring now to the drawings, FIG. 1 is a schematic diagram of an exemplary automated structure modeling system 10 for digital imagery, which may be referred to herein as simply the modeling system 10. The modeling system 10 may comprise target digital images 12 depicting a target structure 14, and may comprise a computer system 16 comprising one or more computer processor 18 and one or more non-transitory computer-readable medium 20. In one embodiment, the modeling system 10 may further comprise a digital library 30 of example digital images 32 depicting example structures 34. In one embodiment, the modeling system 10 may further comprise one or more image capture system 40 comprising one or more image capture device 42 for capturing the target digital images 12 and/or the example digital images 32. For ease of use, the image capture device 42 will be referred to herein as one or more camera 42, but it will be understood that other types of image capture devices 42 may be used. The image capture system 40 may comprise a manned aircraft, an unmanned aircraft (such as a drone remotely controlled by a pilot or an autonomous drone that is self-piloting), a vehicle (either manned or unmanned), or may be carried by a person (such as a smartphone or tablet or camera system).

In general, the modelling system 10 conducts a multi-step process utilizing the computer system 16, including receiving or obtaining the target digital images 12 depicting the target structure 14, producing a heat map model 50 of the target structure 14 from the target digital images 12, producing a two-dimensional model 52 of the target structure 14 (and/or target elements 56) from the heat map model 50 and/or producing a three-dimensional model 54 of the target structure 14 (and/or target elements 56) from the heat map model 50 without further utilizing the target digital images 12. The modelling system 10 may utilize the two-dimensional model 52 and/or the three-dimensional model 54 to determine the target elements 56 (for example, dimensions, areas, facets, feature characteristics, and/or pitch of a roof, wall, window, door, or other structural component; feature identification; feature type, element identification, element type, structural identification, structural type, and/or other structural information, etc.) of the target structure 14. The modelling system 10 may use the example digital images 32 and/or associated known feature data 36 to generate the heat map model 50. In some implementations, the process may include a post-processing step in which the target elements 56 may be used to pre-populate the post processing step and/or may be corrected and/or refined using either manual or automated processes.

The target structure 14 and the example structures 34 are typically houses or other buildings, but may also be other man-made structures. Non-exclusive examples of other man-made structures include roads, bridges, and utilities. The target structure 14 may have a roof 70, one or more facets 72 of the roof 70 and/or of the target structure 14, one or more walls 74, one or more edges 76, and one or more lines 78 (such as ridges and valleys of the roof 70, for example), as well as other features and elements (such as one or more doors 77 and one or more windows 79, for example).

The target digital images 12 and the example digital images 32 can be described as pixelated, 3-dimensional arrays of electronic signals. The three dimensions of such an array consist of spatial elements (for example, x, y or latitude, longitude) and spectral elements (for example, red, green, blue). Each pixel in the target digital images 12 and the example digital images 32 captures wavelengths of light incident on it, limited by the spectral bandpass of the system. The wavelengths of light are converted into digital signals readable by a computer as float or integer values. How much signal exists per pixel depends, for example, on the lighting conditions (light reflection or scattering), what is being imaged, and even the imaged object's chemical properties.

The electronic signals per pixel can be evaluated individually or aggregated into clusters of surrounding pixels. A high-resolution camera, with many individual pixels over a small area, can resolve objects in high detail (which varies with distance to the object and object type). A comparable system with fewer pixels, projected over an equivalent area, will resolve far less detail, as the resolvable information is limited by the per pixel area.

In one embodiment, the target digital images 12 have, or are correlated with, camera geolocation data indicating the location, orientation, and camera parameters of the camera 42 at the precise moment each target digital images 12 is captured. The camera geolocation data can be stored as camera metadata. Exemplary camera metadata includes camera X, Y, and Z information (e.g., latitude, longitude, and altitude of the camera); time; orientation such as pitch, roll, and yaw; camera parameters such as focal length and sensor size; and correction factors such as error due to calibrated focal length, sensor size, radial distortion, principal point offset, and alignment.

The target digital images 12 may be geo-referenced, that is, processed such that pixels in the target digital images 12 have a determined geolocation, such as X, Y, and Z coordinates and/or latitude, longitude, and elevation/altitude coordinates indicative of the location of the pixels in the real world. The determined geolocation, such as X, Y, and Z coordinates and/or latitude, longitude, and elevation/altitude coordinates may be included within the image metadata. See, for example, U.S. Pat. No. 7,424,133 that describes techniques for geolocating oblique images and measuring within the target digital images 12. The entire content of U.S. Pat. No. 7,424,133 is hereby incorporated in its entirety herein by reference. Also see for example WO2018071983, titled "An Image Synthesis System", which is also hereby incorporated by reference in its entirety herein.

The camera metadata and/or the image metadata can be stored within the target digital images 12 or stored separately from the target digital images 12 and related to the target digital images 12 using any suitable technique, such as unique identifiers. In one embodiment, each of the target digital images 12 may have a unique image identifier, such as by use of metadata, or otherwise stored in such a way that allows the computer system 16 to definitively identify each of the target digital images 12. Exemplary image capture components that can be used to capture the target digital images 12 are disclosed in U.S. Pat. Nos. 7,424,133, 8,385,672, and U.S. Patent Application Publication No. 2017/0244880, the entire contents of each of which are hereby incorporated herein by reference.

The target digital images 12 may depict the target structure 14 from two or more perspectives, which may be referred to as views. For example, a first one of the target digital images 12*a* may be captured by the camera 42 from, and depict the target structure 14 from, a nadir perspective (that is, approximately ninety degrees in relation to the target structure 14 from above, approximately straight down), while a second one of the target digital images 12*b* may be captured by the camera 42 from, and depict the target structure 14 from, an oblique perspective (that is, at an angle of less than or more than approximately ninety degrees, but typically between approximately forty-five degrees and approximately sixty-five degrees). In another example, the target digital images 12 may be a single target digital image 12 and may be captured by the camera 42 from, and depict the target structure 14 from, a nadir perspective. In another example, the first one of the target digital images 12 may be captured by the camera 42 from, and depict the target structure 14 from, a first oblique perspective and the second one of the target digital images 12*c* may be captured by the camera 42 from, and depict the target structure 14 from, a second oblique perspective. In another example, the first one of the target digital images 12 may be captured by the camera 42 from, and depict the target structure 14 from, a first oblique perspective and the second one of the target digital images 12 may be captured by the camera 42 from, and depict the target structure 14 from, a second oblique perspective and a third one of the target digital images 12 may be captured by the camera 42 from, and depict the target structure 14 from, a third oblique perspective, wherein the first oblique perspective is an angle that is different from an angle of the second oblique perspective and both the first and second oblique perspective angles are different than the angle of the third oblique perspective.

It will be understood that different numbers of target digital images 12 may be used and that different combinations of different nadir perspective and/or oblique perspectives of the target digital image 12 may be used. For explanatory purposes, one, two, or three target digital images 12 may be shown in the accompanying figures, but other numbers of target digital images 12 may have been used to produce the heat map model 50. The target digital images 12 may also depict an area surrounding and/or abutting the target structure 14.

Additionally, each of the example digital images 32 are associated with known feature data 36. The known feature data 36 may comprise one or more of feature identification, feature type, element identification, element type, structural identification, structural type, and/or other structural information regarding the example structures 34 depicted in the example digital images 32. Nonexclusive examples of the known feature data include the following: identification of a line as a ridge, identification of a line as an eave, identification of a line as a valley, identification of an area as a roof, identification of an area as a facet of a roof, identification of an area as a wall, identification of a feature as a window, identification of a feature as a door, identification of a relationship of lines as a roof, identification of a relationship of lines as a footprint of an example structure 34, identification of an example structure 34, identification of material types, identification of a feature as a chimney, identification of driveways, identification of sidewalks, identification of swimming pools, identification of antennas, and so on. The known feature data 36 may be stored as feature metadata which may can be stored within the example digital images 32 or stored separately from the example digital images 32 and related to example digital images 32 using any suitable technique, such as unique identifiers.

The known feature data 36 may be determined using traditional, known, manual methods or semi-automated methods, such as described in the Background, or as described in U.S. Pat. No. 8,078,436, titled "Aerial Roof Estimation Systems and Methods", which issued Dec. 13, 2011; or U.S. Pat. No. 9,599,466, titled "Systems and Methods for Estimation of Building Wall Area", which issued Mar. 21, 2017, or U.S. Pat. No. 8,170,840, titled "Pitch Determination Systems and Methods for Aerial Roof Estimation", which issued May 1, 2012; or U.S. Pat. No. 10,402,676, titled "Automated System and Methodology for Feature Extraction", which issued Sep. 3, 2019; all of which are expressly incorporated herein in their entirety.

The one or more computer processors 18 may be implemented as a single or plurality of processors 18 working together, or independently to execute the logic as described herein. Exemplary embodiments of the one or more computer processor 18 include a digital signal processor (DSP), a central processing unit (CPU), a field programmable gate array (FPGA), a microprocessor, a multi-core processor, and/or combinations thereof. The one or more computer processor 18 may be capable of communicating with the one or more non-transitory computer-readable medium 20 via a path (e.g., data bus). The one or more computer processor 18 may be capable of reading and/or executing processor executable code and/or of creating, manipulating, altering, and/or storing computer data structures into the one or more non-transitory computer-readable medium 20.

In one embodiment, the computer processor(s) 18 of the computer system 16 may or may not necessarily be located in a single physical location. In one embodiment, the non-transitory computer-readable medium 20 stores program logic, for example, a set of instructions capable of being executed by the one or more computer processor 18, that when executed by the one or more computer processor 18 causes the one or more computer processor 18 to carry out the method 100.

The non-transitory computer-readable medium 20 may be capable of storing processor executable code. The one or more non-transitory computer-readable medium 20 may further store processor executable code and/or instructions, which may comprise program logic. The program logic may comprise processor executable instructions and/or code, which when executed by the one or more computer processor 18, may cause the one or more computer processor 18 to carry out one or more actions.

Additionally, the one or more non-transitory computer-readable medium 20 may be implemented as a conventional non-transitory memory, such as, for example, random access memory (RAM), a CD-ROM, a hard drive, a solid state drive, a flash drive, a memory card, a DVD-ROM, a floppy disk, an optical drive, and/or combinations thereof. It is to be understood that while one or more non-transitory computer-readable medium 20 may be located in the same physical location as the computer processor(s) 18, the one or more non-transitory computer-readable medium 20 may be located remotely from the computer processor(s) 18, and may communicate with the computer processor(s) 18, via a network. Additionally, when more than one non-transitory computer-readable medium 20 is used, a first memory may be located in the same physical location as the computer processor(s) 18, and additional memories may be located in a remote physical location from the computer processor(s) 18. The physical location(s) of the one or more non-transitory computer-readable medium 20 may be varied. Additionally, one or more non-transitory computer-readable medium 20 may be implemented as a "cloud memory" (i.e., one or more non-computer-readable medium 20 may be partially or completely based on or accessed using a network).

Figure 2:
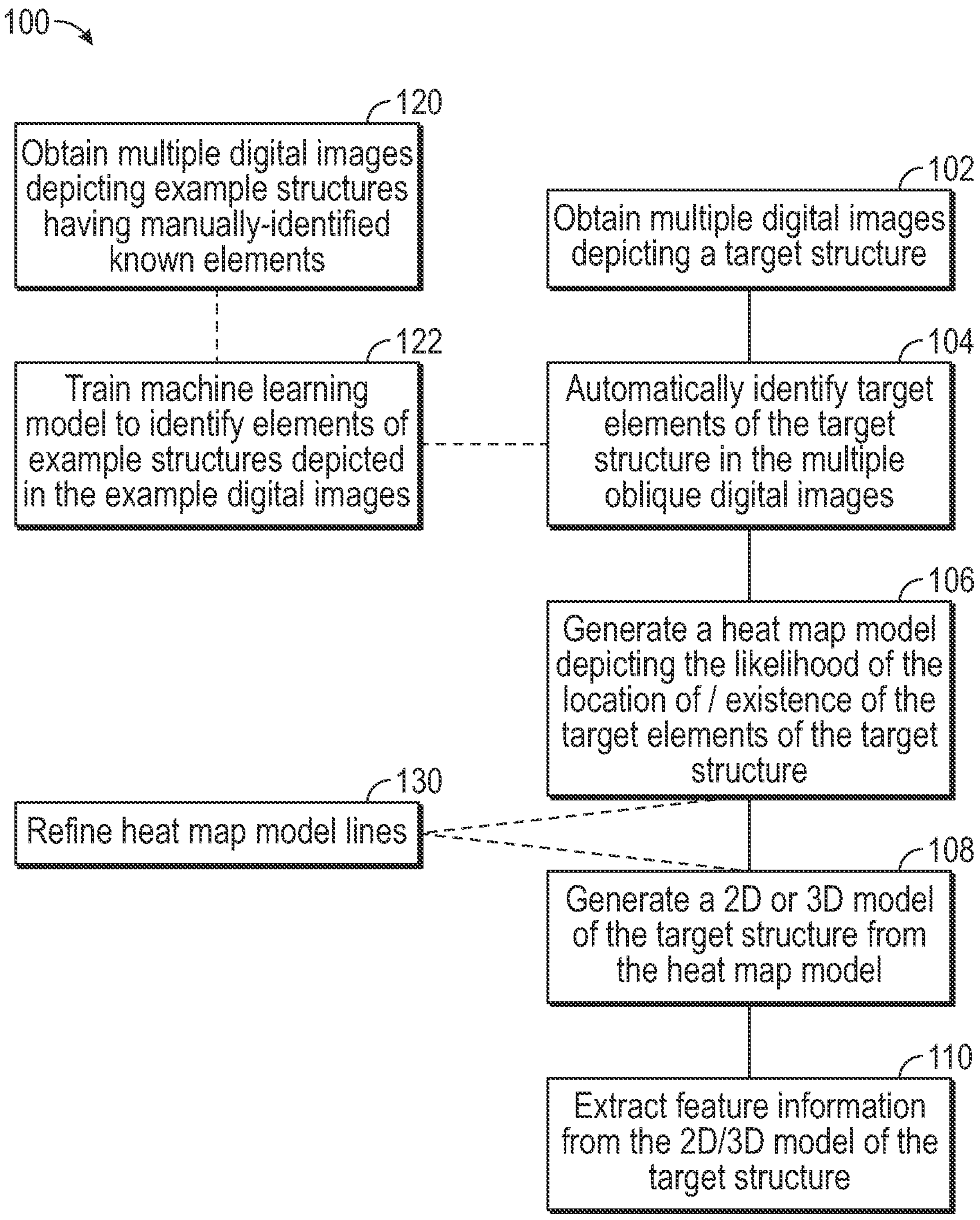
FIG. 2 is an exemplary process flow diagram of an exemplary modeling method in accordance with the present disclosure.
Figure 3A:
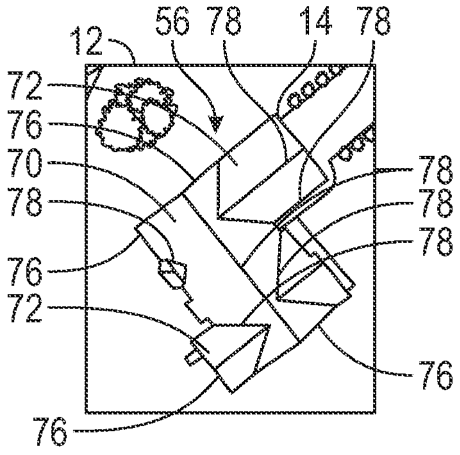
FIG. 3A is an exemplary target digital image in accordance with the present disclosure.
Figure 3B:
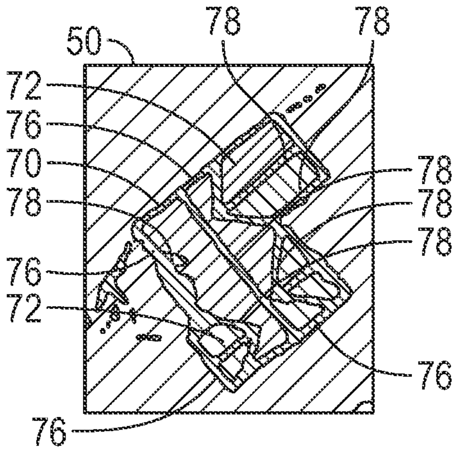
FIG. 3B is an exemplary heat map model in accordance with the present disclosure.
Figure 4A:
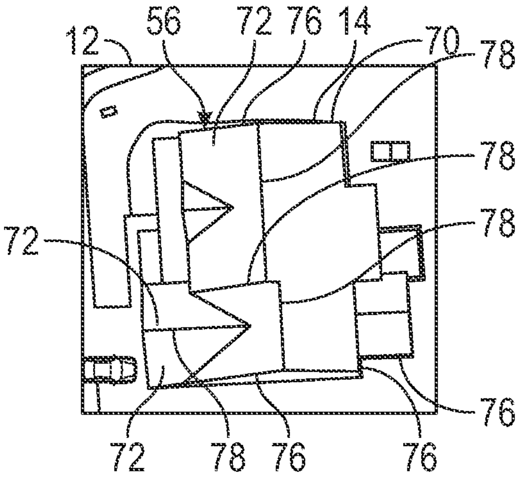
FIG. 4A is an exemplary target digital image in accordance with the present disclosure.
Figure 4B:
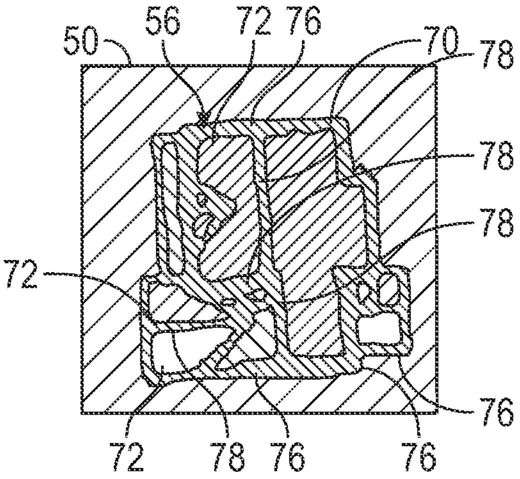
FIG. 4B is an exemplary heat map model in accordance with the present disclosure.
Figure 5A:
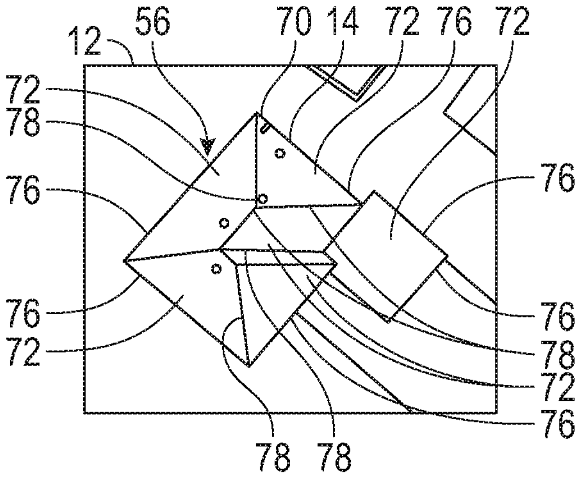
FIG. 5A is an exemplary target digital image in accordance with the present disclosure.
Figure 5B:
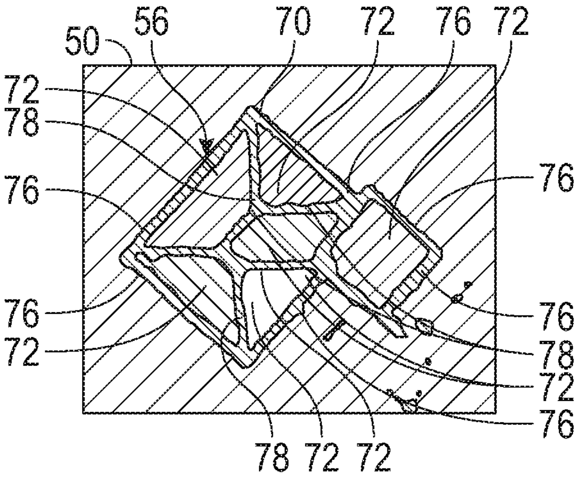
FIG. 5B is an exemplary heat map model in accordance with the present disclosure.
Figure 6A:
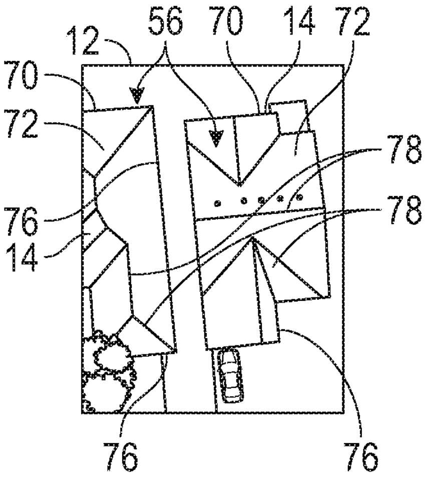
FIG. 6A is an exemplary target digital image in accordance with the present disclosure.
Figure 6B:
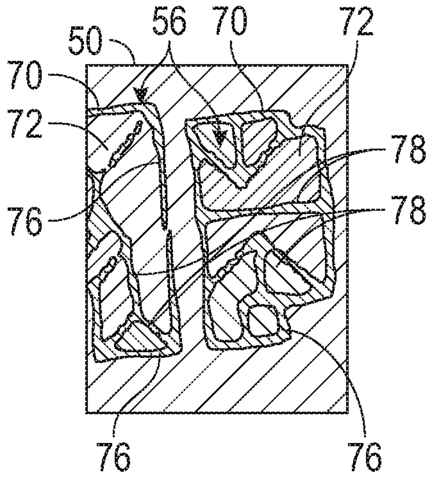
FIG. 6B is an exemplary heat map model in accordance with the present disclosure.

FIG. 2 is a process diagram of an exemplary modeling method 100 of the modeling system 10 in use. In step 102, the computer system 16 may obtain or receive the target digital images 12 depicting the target structure 14. In step 104, the computer system 16 may automatically, with the one or more computer processors 18, identify target elements 56 (for example, features, lines, or edges) of the target structure 14 in the target digital images 12 using machine learning algorithms. In step 106, the computer system 16 may automatically, with the one or more computer processors 18, generate a heat map model 50 depicting the likelihood of the location of and/or the existence of the target elements 56 (for example, one or more features, lines, and/or edges) of the target structure 14. In step 108, the computer system 16 may automatically, with the one or more computer processors 18, generate a two-dimensional or a three-dimensional model of the target structure 14 (and/or of target elements 56) based on the heat map model 50 without further utilizing the original target digital images 12. In step 110, the computer system may extract information regarding the target elements 56 (such as, for example, feature information, dimensional measurements, or pitch) from the two-dimensional or the three-dimensional model of the target structure 14.

The target elements 56 may be any element of interest depicted in the one or more target digital image 12. Non-exclusive examples of target elements 56 include roofs 70, facets 72, walls 74, edges 76, lines 78 (such as ridges, valleys, gutter lines, corners), windows, doors, material types, chimneys, driveways, sidewalks, swimming pools, antennas, feature identification, feature type, element identification, element type, structural identification, structural type, footprints, outlines, and so on.

In some implementations, the method 100 may include a post-processing step in which the target elements 56 may be used to pre-populate the post processing step and/or the target elements 56 may be corrected and/or refined using either manual or automated processes.

In one embodiment, in step 120, the computer system may obtain or receive, with the one or more computer processors 18, the example digital images 32 with the known feature data 36 depicting the example structures 34, such as from the digital library. In one embodiment, in step 122, the computer system 16 may train the machine learning algorithms using the example digital images 32 and the known feature data 36 to recognize one or more of the target elements 56 in the target digital image(s) 12. Of course, it will be understood that steps 120 and 122 may be optional (such as after the machine learning algorithms are robust), may occur once before the machine learning algorithms are used, or may be used multiple times to train and update training of the machine learning algorithms.

Machine Learning (ML) is generally the scientific study of algorithms and statistical models that computer systems use in order to perform a specific task effectively without using explicit instructions, but instead relying on patterns and inference. It is considered a subset of artificial intelligence (AI). Machine learning algorithms build a mathematical model based on sample data, known as "training data", in order to make predictions or decisions without being explicitly programmed to perform the task. Machine learning algorithms are used in a wide variety of applications where it is infeasible to develop an algorithm of specific instructions for performing the task, such as in email filtering, computer vision, and digital imagery analysis. Machine Learning algorithms are commonly in the form of an artificial neural network (ANN), also called a neural network (NN). A neural network "learns" to perform tasks by considering examples, generally without being programmed with any task-specific rules. The examples used to teach a neural network may be in the form of truth pairings comprising a test input object and a truth value that represents the true result from the test input object analysis. When a neural network has multiple layers between the input and the output layers, it may be referred to as a deep neural network (DNN).

For some implementations of machine learning algorithms, as used in step 104, the computer system 16 may be trained to deconstruct digital images into clusters of aggregated pixels and statistically identify correlations in the clusters. The correlations may be iteratively evaluated and "learned" by the computer system, based on a directive to classify a set of patterns as a specific thing. For example, the directive could be to classify the set of patterns to distinguish between a cat and dog, identify all the cars, find the damage on the roof of the building in the clusters, and so on.

Over many imaged objects, regardless of color, orientation, or size of the object in the digital image, these specific patterns for the object are mostly consistent—in effect they describe the fundamental structure of the object of interest. For an example in which the object is a cat, the computer system comes to recognize a cat in a digital image because the system encompasses the variation in species, color, size, and orientation of cats after seeing many digital images or instances of cats. The learned statistical correlations are then applied to new data (such as new digital images) to extract the relevant objects of interest or information (e.g., to identify a cat in a new digital image).

Convolutional neural networks (CNN) are machine learning models that have been used to perform this function through the interconnection of equations that aggregate the pixel digital numbers using specific combinations of connecting the equations and clustering the pixels, in order to statistically identify objects (or "classes") in a digital image. Exemplary uses of Convolutional Neural Networks are explained, for example, in "ImageNet Classification with Deep Convolutional Neural Networks," by Krizhevsky et al. (Advances in Neural Information Processing Systems 25, pages 1097-1105, 2012); and in "Fully Convolutional Networks for Semantic Segmentation," by Long et al. (IEEE Conference on Computer Vision and Pattern Recognition, June 2015); both of which are hereby incorporated by reference in their entirety herein.

When using computer-based supervised deep learning techniques, such as with a CNN, for digital images, a user may provide a series of example digital images 32 of the objects of interest (such as example structures 34) and/or known feature data to the computer system 16 and the computer system 16 may use a network of equations to "learn" significant correlations for the object of interest via statistical iterations of pixel clustering, filtering, and convolving.

The artificial intelligence/neural network output is a similar type model, but with greater adaptability to both identify context and respond to changes in imagery parameters. It is typically a binary output, formatted and dictated by the language/format of the network used, that may then be implemented in a separate workflow and applied for predictive classification to the broader area of interest. The relationships between the layers of the neural network, such as that described in the binary output, may be referred to as the neural network model or the machine learning model.

In one embodiment, the machine learning algorithms used in step 104 may comprise a convolutional neural network (CNN) semantic segmenter. Semantic Segmentation (also known as pixel-wise classification or individual pixel mapping) uses fully convolutional neural networks (FCN) as described in “Fully Convolutional Networks for Semantic Segmentation,” by Long et al., referenced above. In this technique, each pixel in the target digital image 12 is given a label or classification based on training data examples, as discussed above.

In one embodiment, the CNN semantic segmenter of step 104 may be a pyramid scene parsing deep learning algorithm. For example, the CNN semantic segmenter may be a pyramid scene parsing deep learning algorithm as described in the publication by Zhao et al. entitled “Pyramid Scene Parsing Network” (2017 IEEE Conference on Computer Vision and Pattern Recognition (CVPR) (2016): 6230-6239), and is referred to herein as the Zhao algorithms.

The Zhao algorithms first use a CNN to produce a feature map of the last convolutional layer of an input image, then a pyramid pooling module is applied to harvest different sub-region representations, followed by up-sampling and concatenation layers to form the final feature representation, which carries both local and global context information in. Finally, the representation is fed into a convolution layer to get the final per-pixel prediction.

The pyramid pooling module may fuse features under four different pyramid scales. The coarsest level is global pooling to generate a single bin output. The following pyramid level separates the feature map into different sub-regions and forms pooled representation for different locations. The output of different levels in the pyramid pooling module contains the feature map with varied sizes. To maintain the weight of global feature, 1×1 convolution layer is used after each pyramid level to reduce the dimension of context representation to 1/N of the original one if the level size of pyramid is N. Then the low-dimension feature maps are directly up-sampled to get the same size feature as the original feature map via bilinear interpolation. Finally, different levels of features are concatenated as the final pyramid pooling global feature. Further details of the Zhao algorithms are known to persons having ordinary skill in the art.

It will be understood, however, that other or additional machine learning algorithms may be used to output the likelihood of the pixels in the target digital images 12 as representing the target elements 56 of the target structure 14 depicted in the target digital images 12 to generate the heat map model 50.

Turning now to step 106 of the method 100, the heat map model 50 generated by the computer system may be based on the output of the machine learning algorithms, such as the CNN semantic segmenter. The heat map model 50 depicts the likelihood of the target elements 56 (for example features, lines, and/or edges) of the target structure 14 being represented in the target digital images 12. That is, the more likely that the features, lines, and/or edges are truly the features, lines, and/or edges in the target digital images 12, then the clearer and/or darker the lines and/or areas depicted in the heat map model 50. The heat map model 50 may be indicative of spatial intensity, that is the distribution of the most relevant information. The heat map model 50 may be indicative of the most likely location of the target elements 56 of the target structure 14 depicted in the target digital images 12. The heat map model 50 may be indicative of a level of confidence of the presence of a target element 56 in a particular pixel or group of pixels in the target digital image 12.

The machine learning algorithms may be targeted to generate the heat map model 50 of one or more of the target elements 56 and/or the entire target structure 14. In one embodiment, a user may designate which of the target element(s) 56 may be targeted for generation in the heat map model 50. In one example, the machine learning algorithms may generate a heat map model 50 of a roof 70 of the target structure 14. In another example, the machine learning algorithms may generate a heat map model 50 of a particular wall or edge of the target structure 14.

FIGS. 3A-6B depict examples of the heat map models 50 (FIGS. 3B, 4B, 5B, 6B) generated based on the results of the application of the CNN semantic segmenter to corresponding target digital images 12 (including those shown in FIGS. 3A, 4A, 5A, and 6A). Though the target digital images 12 shown include only one nadir view of each target structure 14, it will be understood that additional target digital images 12 may be used having additional views, such as oblique views.

For example, the heat map models 50 in FIGS. 3B, 4B, 5B, and 6B depict the likelihood of the presence of the target elements 56, such as facets 72, edges 76, and lines 78, of each target structure 14 in the target digital images 12, examples of which are shown in FIGS. 3A, 4A, 5A, and 6A. Note that not all of the target elements 56 are labeled in the Figures, for purposes of clarity. In these examples, the roofs 70 of the target structures 14, as well as facets 72 of the roofs, edges 76 of the roofs, and other lines 78 of the roofs (such as ridges and valleys, for example) are modelled in the heat map models 50. In one embodiment, the surrounding area that is determined to be not part of the target structure 14 may be excluded from the heat map model 50. In one embodiment, the facets 72 may be shown in varying shades of white to gray to indicate individual facet components. In one embodiment, the facets may be grouped by architectural unit.

Referring again to FIG. 2, in one embodiment, the method 100 may comprise a step 130, in which lines and/or connections of lines of the heat map model 50 are refined. In one embodiment, generating the two-dimensional model 52 or the three-dimensional model 54 with the computer system 16 in step 108 of the method 100 may further include the use of computer vision techniques and/or geometric rules to recognize shapes and/or structures formed by the heat map model 50. In one embodiment, the lines and/or connections depicted in the heat map model 50 may be refined using line segment detection and/or connected components techniques, to refine the identification of independent structural elements and facets 72.

In one embodiment, line segment detection may be implemented using the methods and algorithms detailed in the publication by Gioi et al., entitled “LSD: a Line Segment Detector”, published in Image Processing On Line, 2 (2012), pp. 35-55, which may be referred to herein as the Gioi algorithms. The Gioi algorithms start by computing the level-line angle at each pixel to produce a level-line field, i.e., a unit vector field such that all vectors are tangent to the level line going through their base point. Then, this field is segmented into connected regions of pixels that share the same level-line angle up to a certain tolerance. These connected regions are called line support regions. Each line support region (a set of pixels) is a candidate for a line segment. A line segment is a locally straight contour on the target digital image 12. The corresponding geometrical object (e.g., a rectangle) is associated with it. The principle inertial axis of the line support region may be used as main rectangle direction and the size of the rectangle may be chosen to cover the full region. Each rectangle is subject to a validation procedure. The total number of pixels in the rectangle and its number of aligned points (that is, the pixels in the rectangle whose level-line angle corresponds to the angle of the rectangle up to the tolerance) are counted and used to validate the rectangle as a detected line segment. Further details of the Gioi algorithms are known to persons having ordinary skill in the art.

In one embodiment, connected components techniques may be implemented using the methods and algorithms detailed in the publication by Lopez et al, entitled "On Computing Connected Components of Line Segments" (published in IEEE Transactions on Computers, 44, 4 (April 1995), 597-601), which may be referred to herein as the Lopez algorithms. The Lopez algorithms include merging at a node by building lower and upper contours of the connected components computed at the node; partitioning the descendants of the node into local and global segments (where a segment is local if both of its endpoints lie within the upper and lower contour of a single connected component at the node, and where a segment is global if it intersects at least one contour at the node, and segments that are neither local nor global intersect no segments at the node and can be ignored); and for each segment from a strict descendant of the node do the following: if the segment is local, and if the segment intersects any segments from the connected component at the node whose lower and upper contours enclose the segment, then merge the connected component with the component of the segment; or, if the segment is global, and if the connected component is a connected component at the node such that the segment intersects at least one of the contours of the component, then merge the connected component with the partial component of the segment. Further details of the Lopez algorithms are known to persons having ordinary skill in the art.

It will be understood, however, that other or additional algorithms may be used to refine the identification of independent structural elements (including lines and lines connections and facets).

Returning now to FIG. 2, in one embodiment, the computer system 16 may then use the refined heat map model 50 to generate the two-dimensional model 52 or the three-dimensional model 54 in step 108 of the method 100.

Figure 7A:
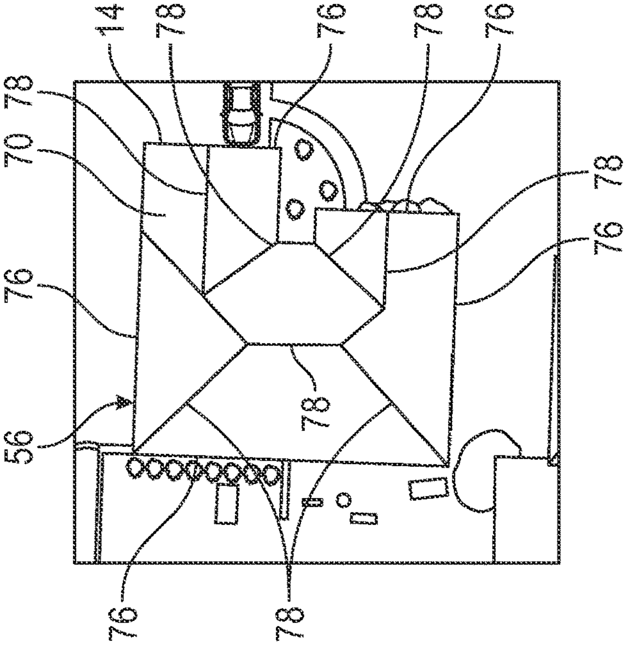
FIG. 7A is an exemplary target digital image in accordance with the present disclosure.
Figure 7B:
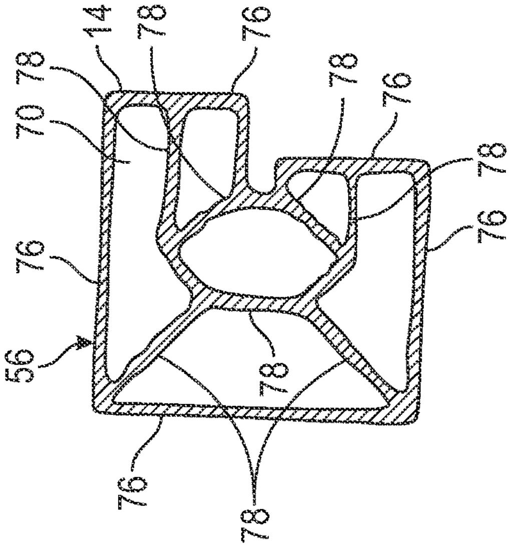
FIG. 7B is an exemplary heat map model in accordance with the present disclosure.
Figure 7C:
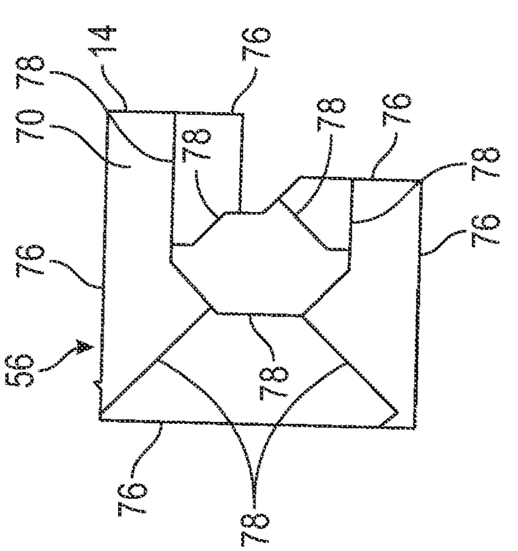
FIG. 7C is an exemplary two-dimensional model in accordance with the present disclosure.

FIGS. 7A, 7B, and 7C illustrate an example of the method 100 in which the computer system receives or obtains the target digital image 12 (exemplified for clarity by a single target digital image 12 in FIG. 7A), automatically identifies the target elements 56 of the target structure 14 depicted in the target digital image 12 using CNN semantic segmentation, automatically generates the heat map model 50 (depicted in FIG. 7B), and then refines the heat map model 50 to produce the two-dimensional model 52 (depicted in FIG. 7C) of the target structure 14 depicted in the target digital image 12 by using line segment detection and/or connecting components.

Figure 8A:
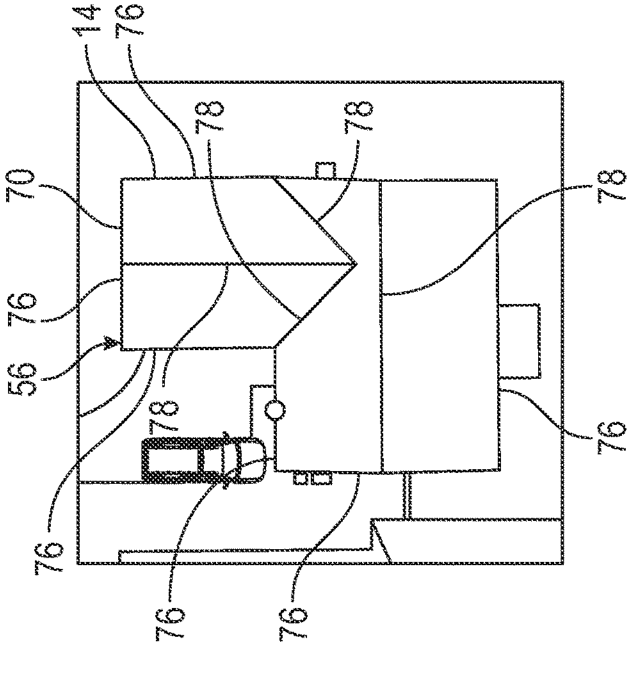
FIG. 8A is an exemplary target digital image in accordance with the present disclosure.
Figure 8B:
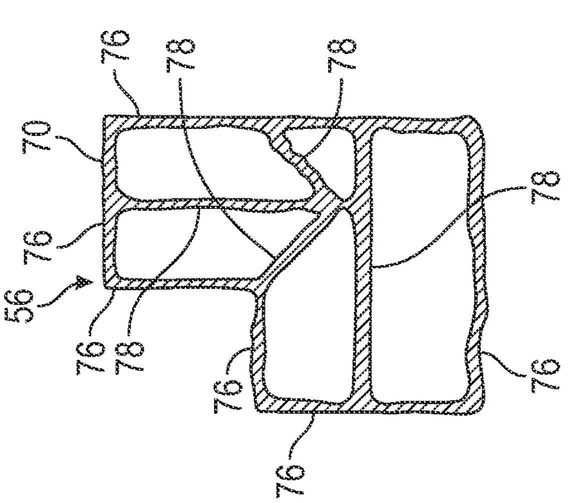
FIG. 8B is an exemplary heat map model in accordance with the present disclosure.
Figure 8C:
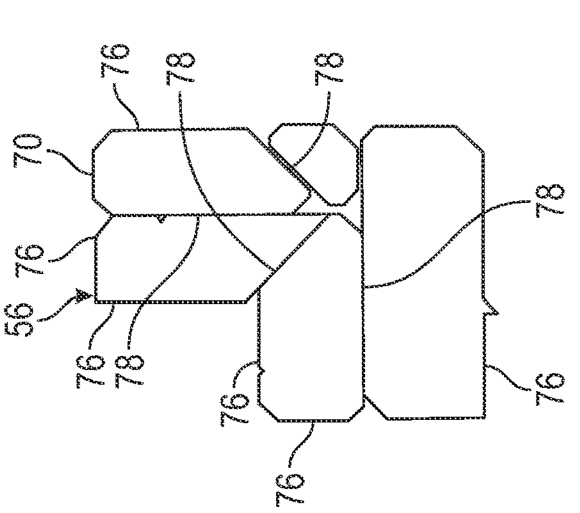
FIG. 8C is an exemplary two-dimensional model in accordance with the present disclosure.

FIGS. 8A, 8B, and 8C illustrate another example. In FIG. 8A, the target digital images 12 (exemplified by a single digital image) depict a target structure 14. Next, the heat map model 50 (FIG. 8B) is generated by the computer system 16 based on the target elements 56 identified through the application of the CNN semantic segmenter to the target digital image 12. Finally, the two-dimensional model 52 (FIG. 8C) is generated by the computer system 16 based on the heat map model 50. The computer system 16 may apply algorithms to recognize the shapes created by the lines of the heat map model 50 to generate the two-dimensional model 52 (and/or a three-dimensional model). For example, in one embodiment, algorithms for grouping contours may be used, or other computer vision approaches known to persons having ordinary skill in the art.

Figure 9C:
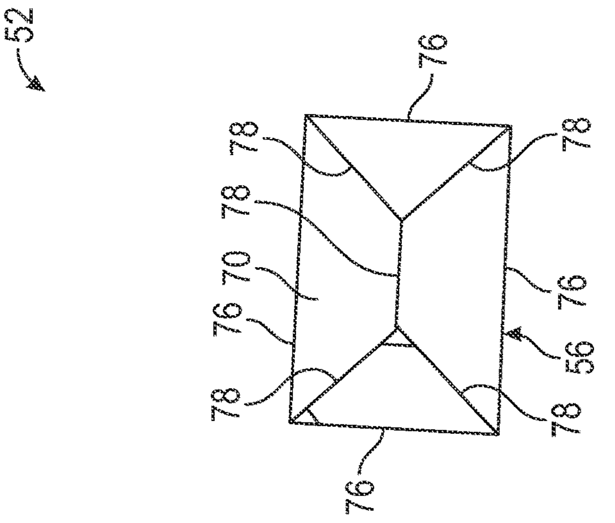
FIG. 9C is an exemplary two-dimensional model in accordance with the present disclosure.
Figure 9B:
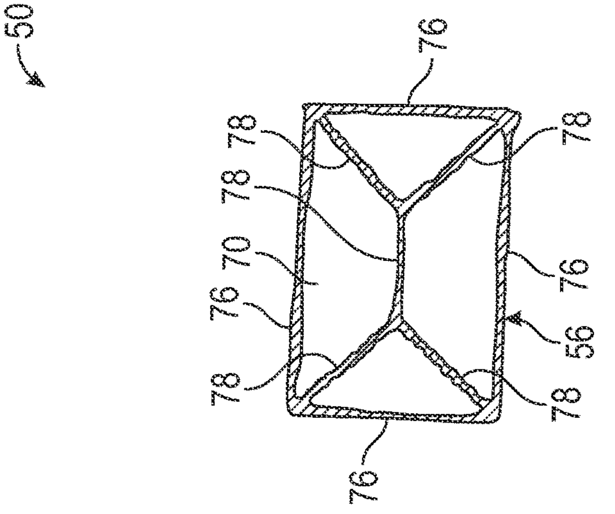
FIG. 9B is an exemplary heat map model in accordance with the present disclosure.
Figure 9A:
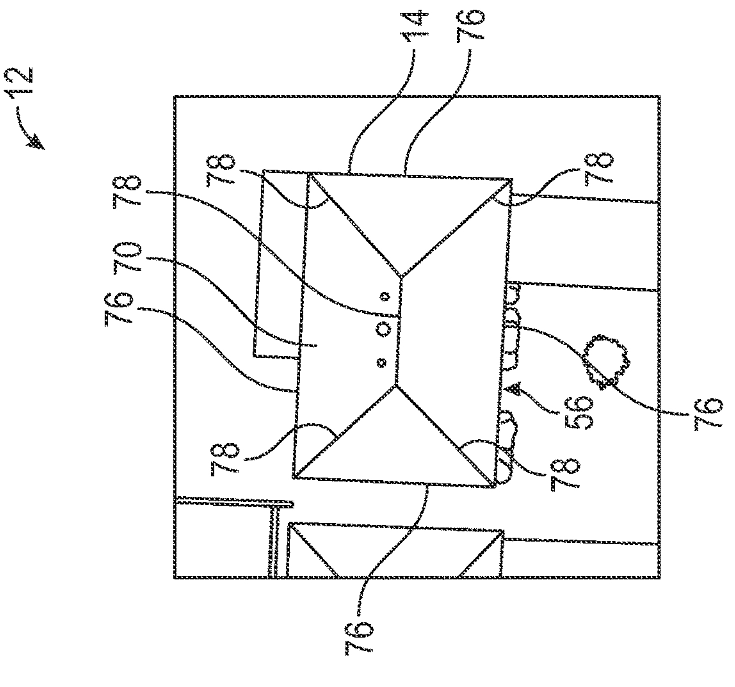
FIG. 9A is an exemplary target digital image in accordance with the present disclosure.

In another example, FIGS. 9A, 9B, and 9C illustrate the exemplary target digital image 12 (FIG. 9A) depicting a target structure 14, the heat map model 50 (FIG. 9B) generated by the computer system 16 based on the target element(s) 56 identified through the application of the CNN semantic segmenter to the target digital image 12, and the two-dimensional model 52 (FIG. 9C) generated by the computer system 16 based on the heat map model 50. The computer system 16 may apply algorithms to recognize the shapes created by the lines of the heat map model 50 (such as in a raster image of the heat map model 50) to generate the two-dimensional model 52 (and or a three-dimensional model).

Figure 10A:
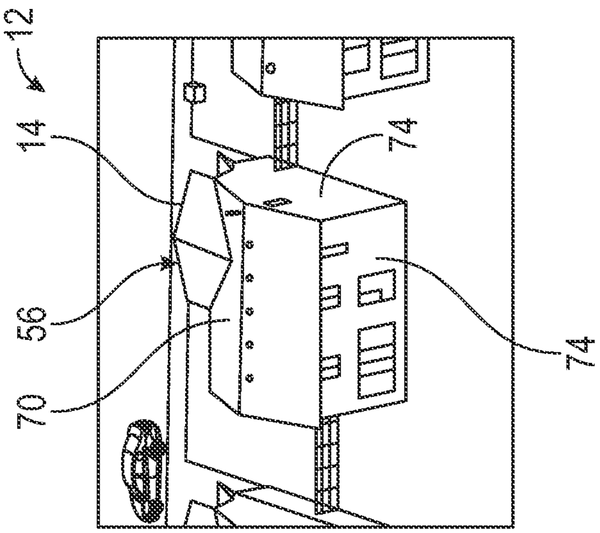
FIG. 10A is an exemplary target digital image in accordance with the present disclosure.
Figure 10B:
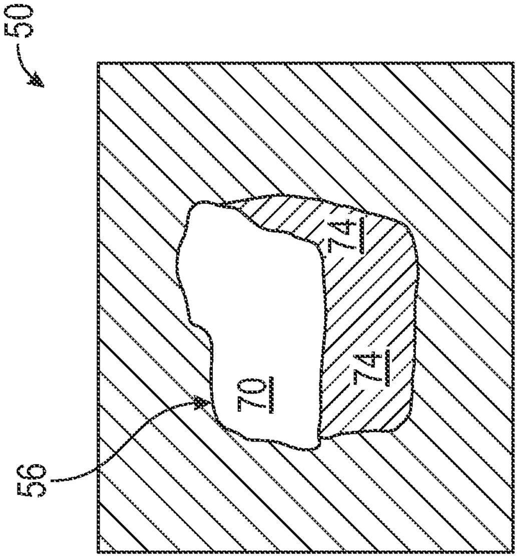
FIG. 10B is an exemplary heat map model in accordance with the present disclosure.
Figure 10C:
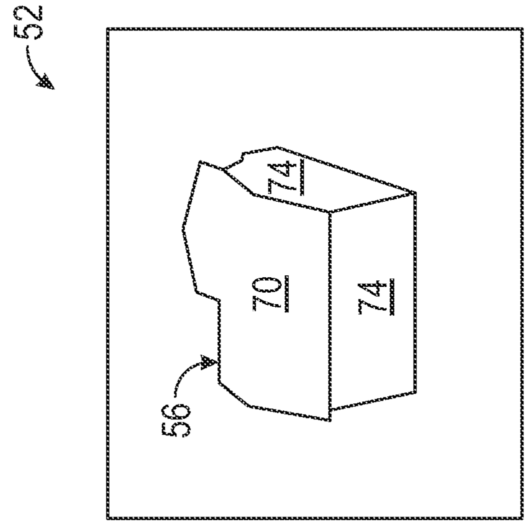
FIG. 10C is an exemplary three-dimensional model in accordance with the present disclosure.

In one embodiment, illustrated in FIGS. 10A, 10B, and 10C, particular target elements 56 that are features of the target structure 14 may be identified in the three-dimensional model 54 using the heat map model 50 by utilizing the CNN semantic segmenter to identify the feature. For example, the roof 70 and the walls 74 of the target structure 14 may be identified as target elements 56 in the heat map model 50 (FIG. 10B) using the CNN semantic segmenter applied to the target digital image 12 (FIG. 10A). Then the three-dimensional model 54 (FIG. 10C) may be generated depicting the roof 70 and the walls 74 (for example, in contrast to identifying additional lines 78 or additional edges 76) based on the target elements 56 in the heat map model 50.

Figure 11C:
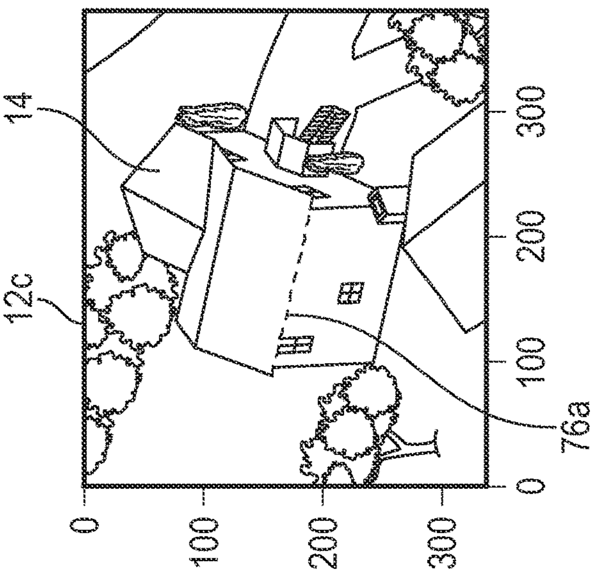
FIG. 11C is yet another exemplary target digital image overlaid with a target element in accordance with the present disclosure.
Figure 11B:
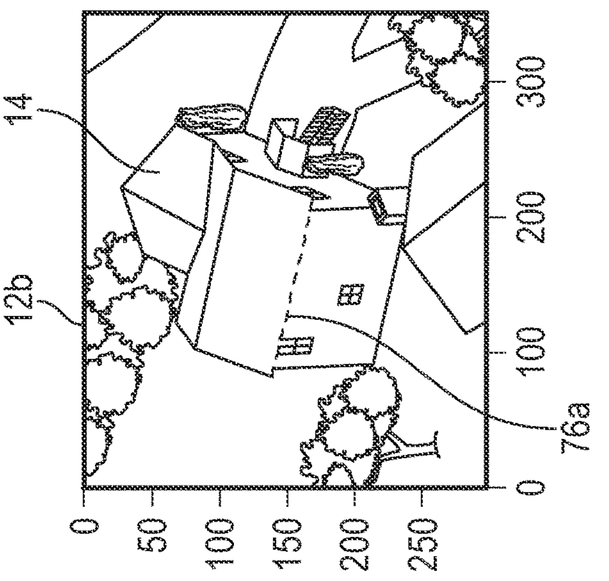
FIG. 11B is another exemplary target digital image overlaid with a target element in accordance with the present disclosure.
Figure 11A:
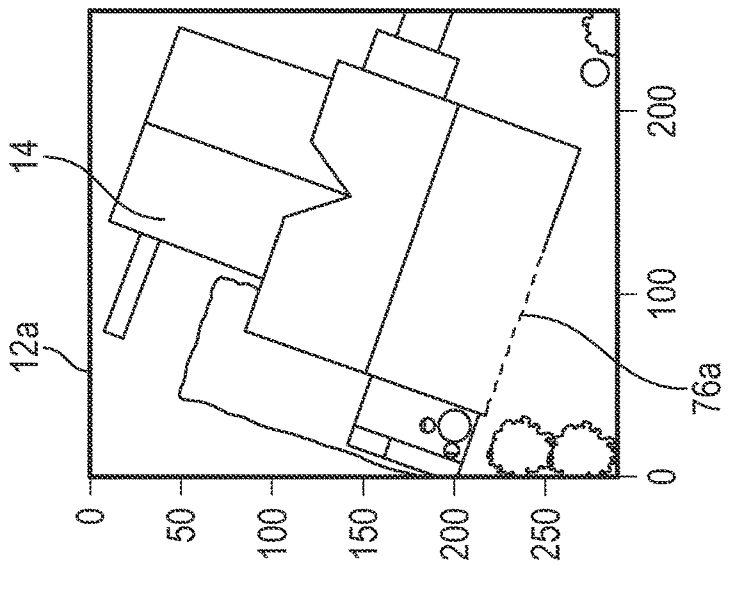
FIG. 11A is an exemplary target digital image overlaid with a target element in accordance with the present disclosure.

In one embodiment, as illustrated in FIGS. 11A, 11B, and 11C, the target digital images 12 comprise three or more target digital images 12, such as a first target digital image 12*a*, a second target digital image 12*b*, and a third target digital image 12*c* (and so on), such that at least three different perspective views of the target structure 14 are depicted in the target digital images 12. For purposes of clarity, three target digital images 12 will be used in the following description, however, it will be understood that more or less than three may be used. The computer system 16 may identify the target elements 56 in each of the first target digital image 12*a*, the second target digital image 12*b*, and the third target digital image 12*c* using machine learning techniques, such as the CNN semantic segmenter, in step 106. Additionally, the computer system 16 may utilize the image metadata that contains the geolocation of each pixel in the first, second, and third target digital images 12*a*, 12*b*, 12*c*, to match the target elements 56 identified in the heat map model 50 of the first target digital image 12*a* to the target elements 56 identified in the heat map model 50 of the second target digital image 12*b* to the target elements 56 in the heat map model 50 of third target digital image 12*c* based on matching geolocations, in order to generate the three-dimensional model 54 in step 108 by mapping the known locations of each target elements 56.

For example, the pixels representing a target element 56 (edge 76*a*) are identified in step 104, and generated in step 106 as part of the heat map model 50 and generated in the three-dimensional model 54. As an example of the use of the geolocation information, the heat map model 50 of the edge 76*a* is shown in the first target digital image 12*a*, the second target digital image 12*b*, and the third target digital image 12*c* based on the associated image metadata containing the geolocation of each pixel. The geolocation of the edge 76*a* may be matched across the first target digital image 12*a*, the second target digital image 12*b*, and the third target digital image 12*c* to generate a three-dimensional model 54 of the edge 76*a*. The generated heat map model 50 and/or the three-dimensional model 54 may be mapped to the target structure 14 geospatially, as each pixel is associated with its projected location on earth through the geolocation information. In the example shown in FIGS. 11A-11C, the exemplary edge 76*a* may be mapped to the represented feature in the digital images 12*a*, 12*b*, 12*c*, regardless of orientation of the digital images 12*a*, 12*b*, 12*c*, since the camera projection information (from the camera metadata) enables the modelling system 10 to map features in latitude, longitude, and altitude.

Two-dimensional planes may be fit to each of the edges 76*a* in the target digital images 12*a*, 12*b*, 12*c*, and mapped to spatial coordinates using the camera orientation parameters (from the camera metadata). The projected planes may be compared across the target digital images 12*a*, 12*b*, 12*c* in order to determine if the edges 76*a* are identical in 3D space. Matching of other target elements 56 may be repeated to generate additional elements of the three-dimensional model 54.

Figure 12A:
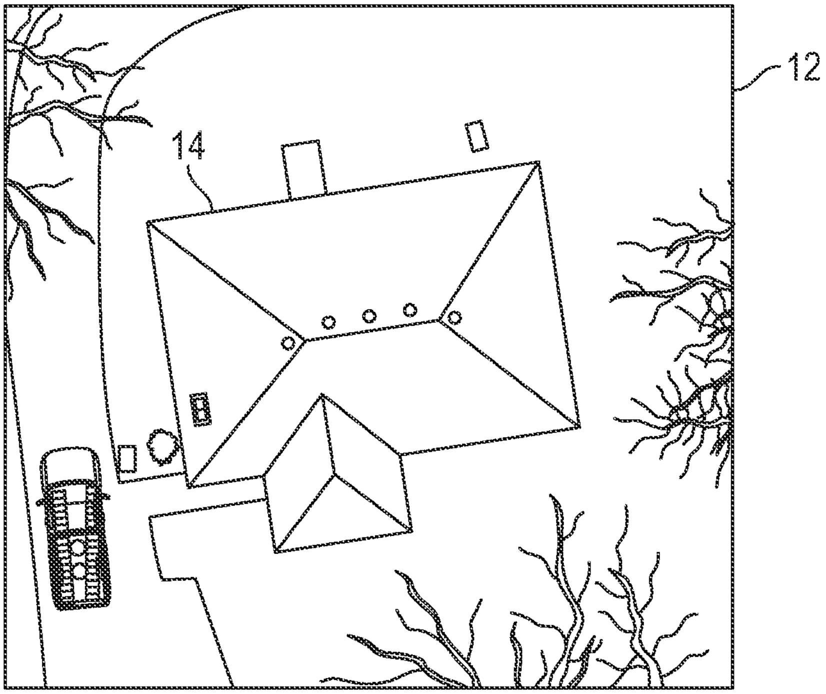
FIG. 12A is an exemplary digital image in accordance with the present disclosure.
Figure 12B:
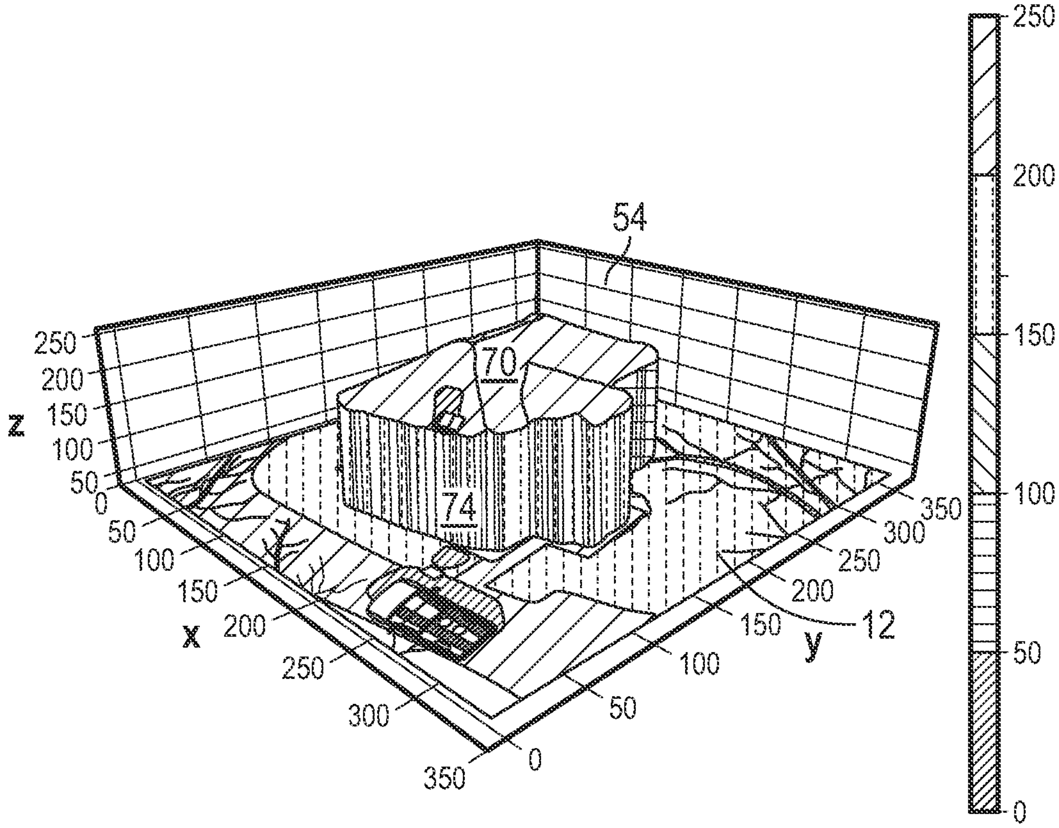
FIG. 12B is an exemplary three-dimensional model in accordance with the present disclosure.
Figure 12C:
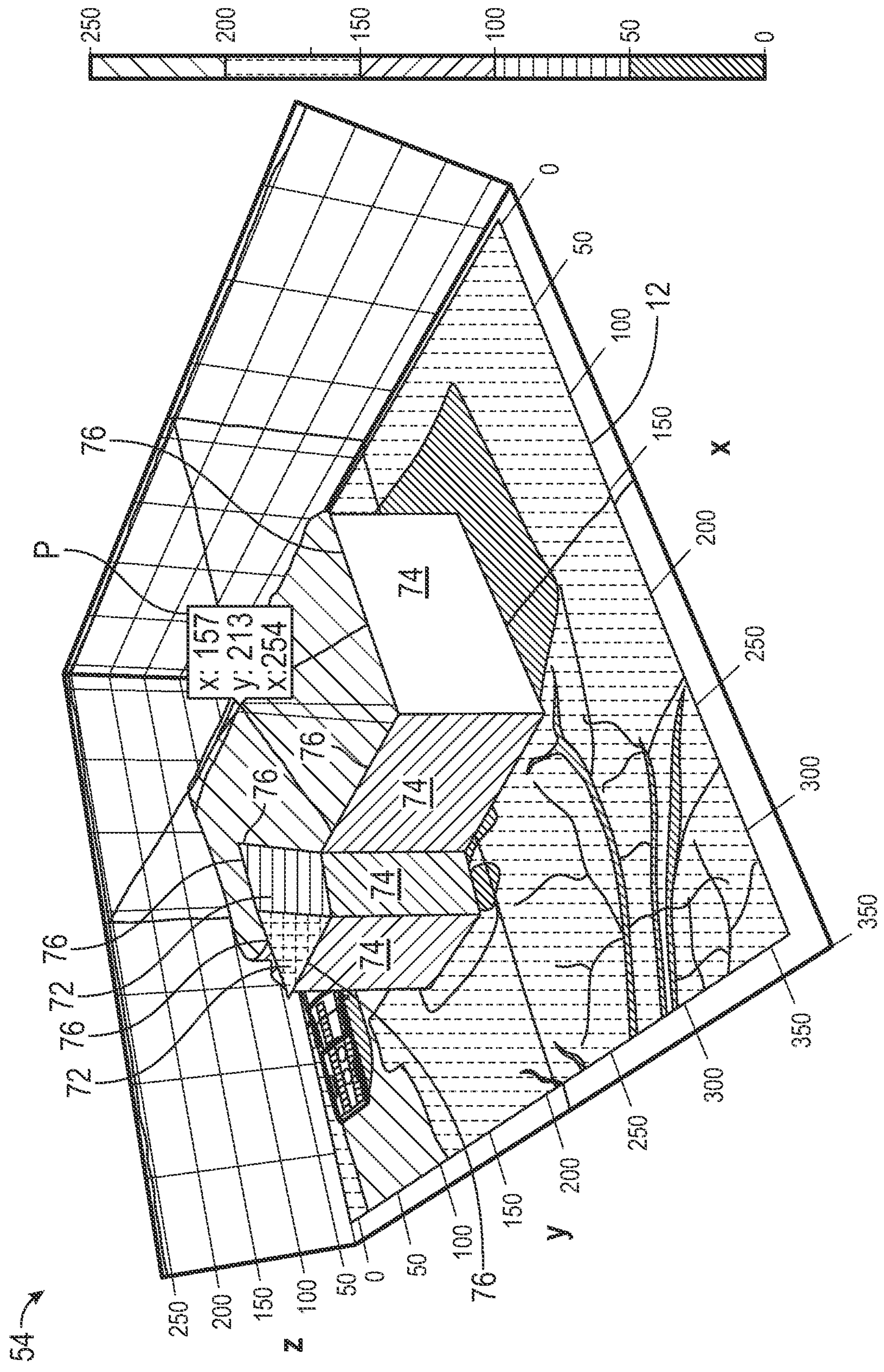
FIG. 12C is an exemplary three-dimensional model showing target elements in accordance with the present disclosure.

For example, FIGS. 12A, 12B, and 12C illustrate one example in which features (shown in FIG. 12C) of the target structure 14 of the target digital image 12 (shown in FIG. 12A and representing one or more target digital images 12) have been determined within the three-dimensional model 54 (shown in FIGS. 12B and 12C). For example, as shown in FIG. 12C, roof facets 72, walls 74, and edges 76, have been identified in the three-dimensional model 54 of FIG. 12B. Specific features may be geolocated across additional target digital images 12 using the geolocation information available for each pixel from a first target digital image 12, such as shown for point P of FIG. 12C.

In one embodiment, the geolocation matching used to generate the three-dimensional model 54 (or portions of the three-dimensional model 54) may be a modified view matching technique. In one embodiment, the modified view matching technique may be based on techniques described in the publication by Baillard at al., entitled "Automatic line matching and 3D reconstruction of buildings form multiple views" (ISPRS Conference on Automatic Extraction of GIS Objects from Digital Imagery, September 1999, Munich, Germany), which may be referred to herein as the Baillard algorithms. In the Baillard algorithms the 3D position of detected lines in each target digital image 12 is determined through the projection of a 2D plane through the line segments, mapped to geolocation coordinates using the camera parameters. Across all the target digital images 12, if the 2D planes intersect a common line in 3D space, the lines are determined to be the same across the image set (that is, target digital images 12*a*, 12*b*, 12*c*). Further details of the Baillard algorithms are known to persons having ordinary skill in the art. It will be understood, however, that other or additional algorithms may be used to recognize shapes and/or structures within the heat map model 50 and to match geolocations of pixels.

In one embodiment, pitch of the roof 70 of the target structure 14 may be determined in generating the two-dimensional model 52 and/or the three-dimensional model 54 of the target structure 14. After the heat map model 50 is generated, lines of the heat map model 50 may be cleaned (e.g., clarified) and vectorized from a raster image of the heat map model 50 as part of the generation of the two-dimensional model 52 and/or three-dimensional model 54. Additionally, lines from the raster image of the heat map model 50 may be mapped to a new look angle observed by the camera 42 (that is, a new view point angle, also known as orientation of the target digital image 12). Because the heat map model 50 is derived from the target digital image 12, and the target digital image 12 has geolocation information (e.g., camera metadata and/or image metadata), each output of the heat map model 50 can be mapped in the two-dimensional model 52 and/or the three-dimensional model 54 to a set of geolocated points (for example, latitude/longitude/elevation points). Additionally, the same lines (or points or features) can be mapped to additional target digital images 12 because of the known geolocation information. Further, lines that connect with one another and that can be described as having specific vertices and connected endpoints in the heat map model 50, may become self-contained features (such as facets 72, walls 74, and so on).

For example, individual lines may be mapped to particular roof facets, or singular roof planes, such that multiple roof planes combine to form a single roof 70. The lines may be mapped on a target digital image 12 having a nadir view of the target structure 14 to determine to what roof sections they are connected. For each facet, two non-parallel lines that have been detected and identified as part of the same roof plane may be used to compute the perpendicular vector of that plane with the cross product. The angle between the perpendicular vector and the vertical direction corresponds to the roof pitch. The roof pitch may be expressed in a 0 to 12 scale and/or as a percentage of 45 degrees.

Figure 13:
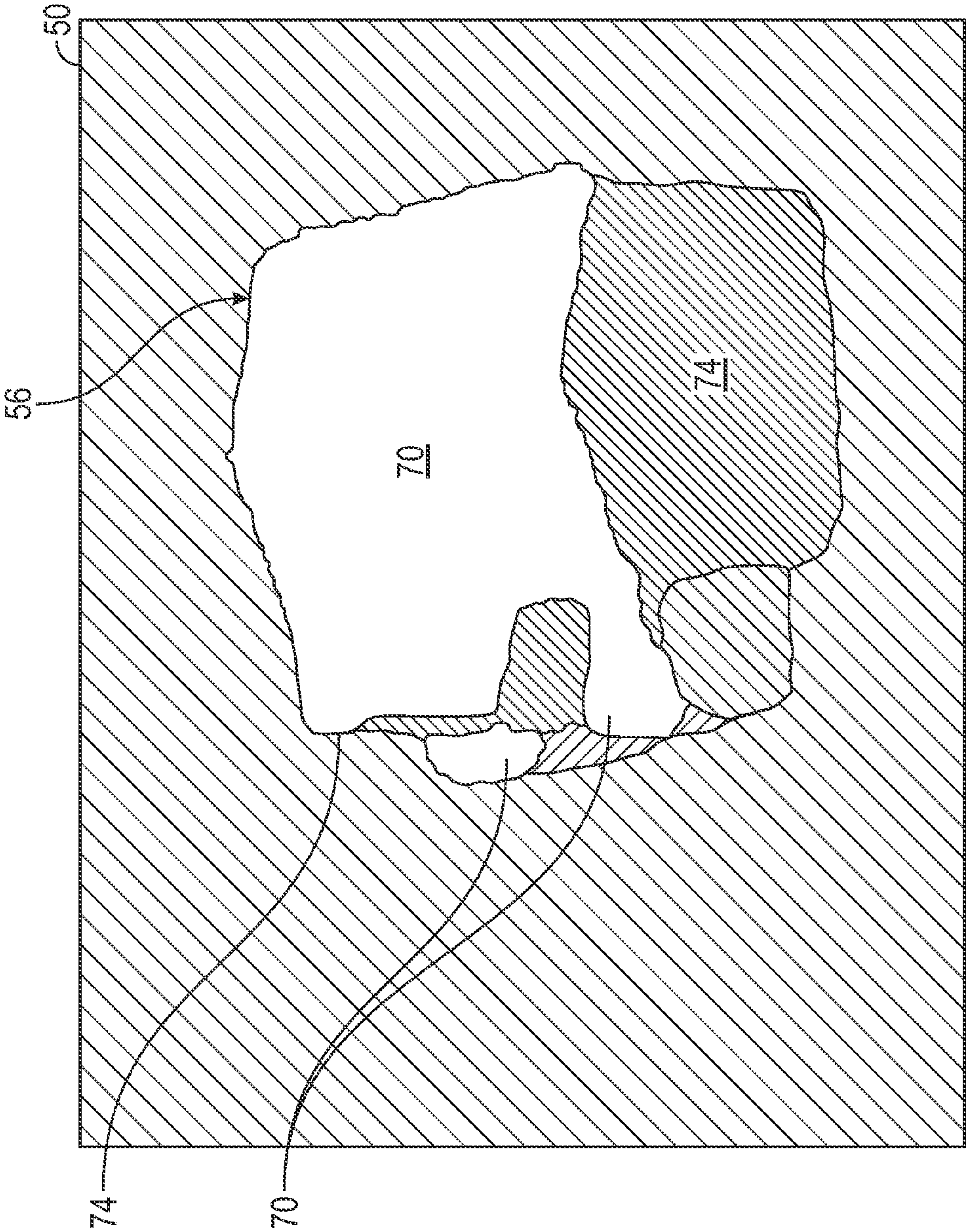
FIG. 13 is an exemplary heat map model in accordance with the present disclosure.
Figure 14A:
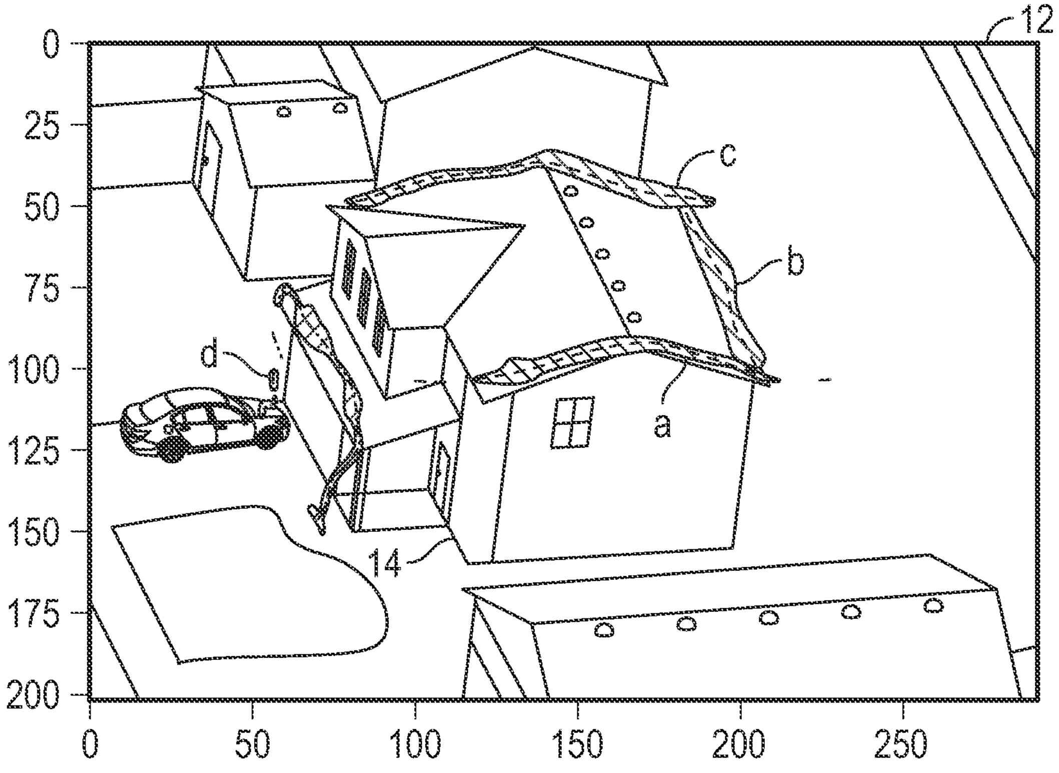
FIG. 14A is an exemplary target digital image overlaid with target elements from an exemplary heat map model in accordance with the present disclosure.
Figure 14B:
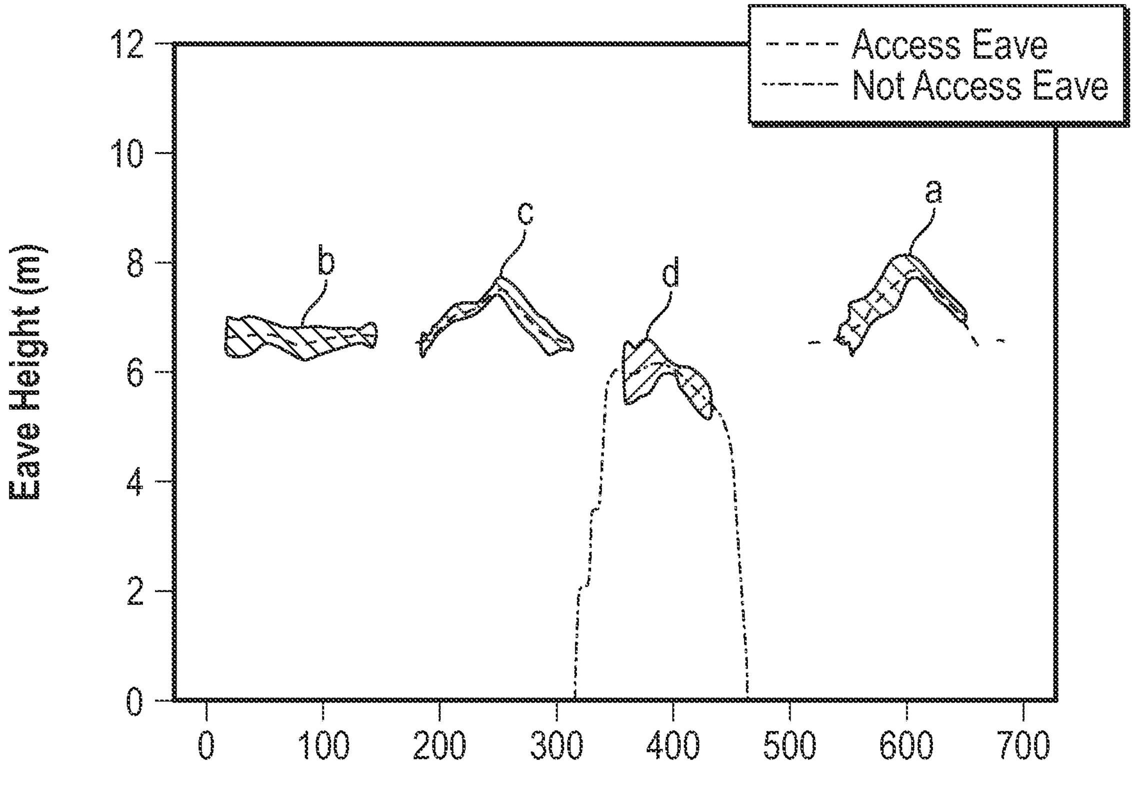
FIG. 14B is a graphical view of detected target elements in accordance with the present disclosure.

In one embodiment, other target elements 56 of the target structure 14 may be determined in generating the three-dimensional model 54 of the target structure 14. For elevation measurements like eave height, target digital images 12 having an oblique perspective may be segmented to produce a heat map model 50 of the roof 70 and wall 74 features, such as in FIG. 13. For example, the difference, or height, between lower wall pixels and lower roof edge pixels may be calculated and mapped to projected elevation based on the camera orientation. The height from each target digital images 12 may be compared across all the target digital images 12 (or a subset of the target digital images 12) and the lowest difference may be categorized as the eave height. FIG. 14A illustrates the heat map model 50 of eaves superimposed on the target digital image 12. Accessible eaves (that is, eaves giving physical access to the highest portion of the roof for roofer/contractor purposes) may be determined from the identification of additional wall features above the identified lower roof (in 3D space), as shown in FIG. 14A. A consolidated view of the detected eave heights may be shown, as illustrated in FIG. 14B.

Figure 15:
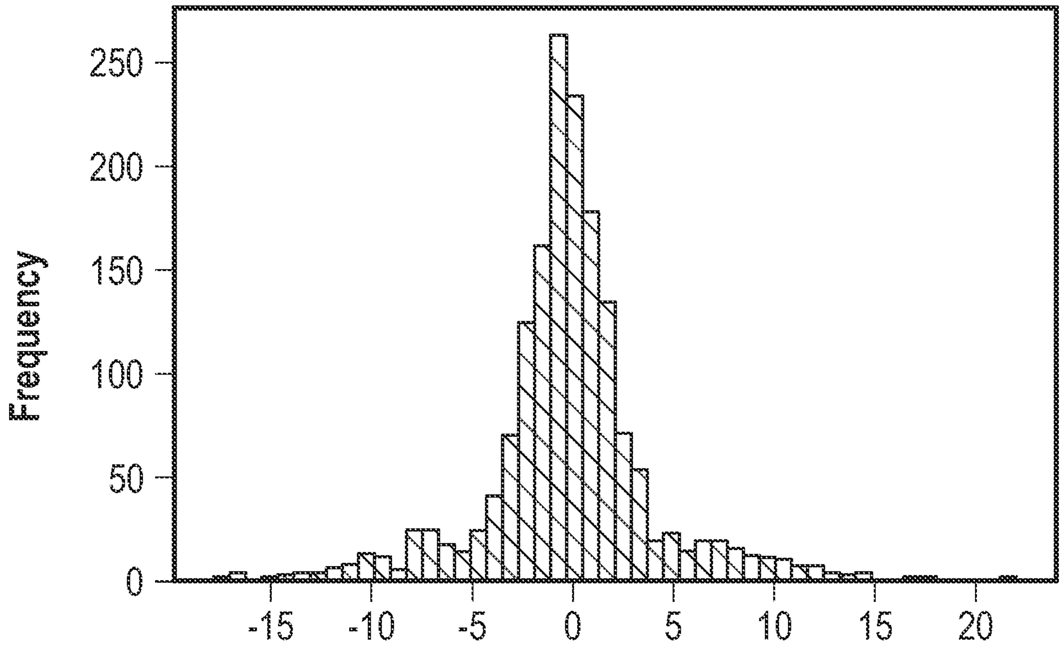
FIG. 15 is an exemplary graph of results of experimental usage of an exemplary modeling method in accordance with the present disclosure.
Figure 16:
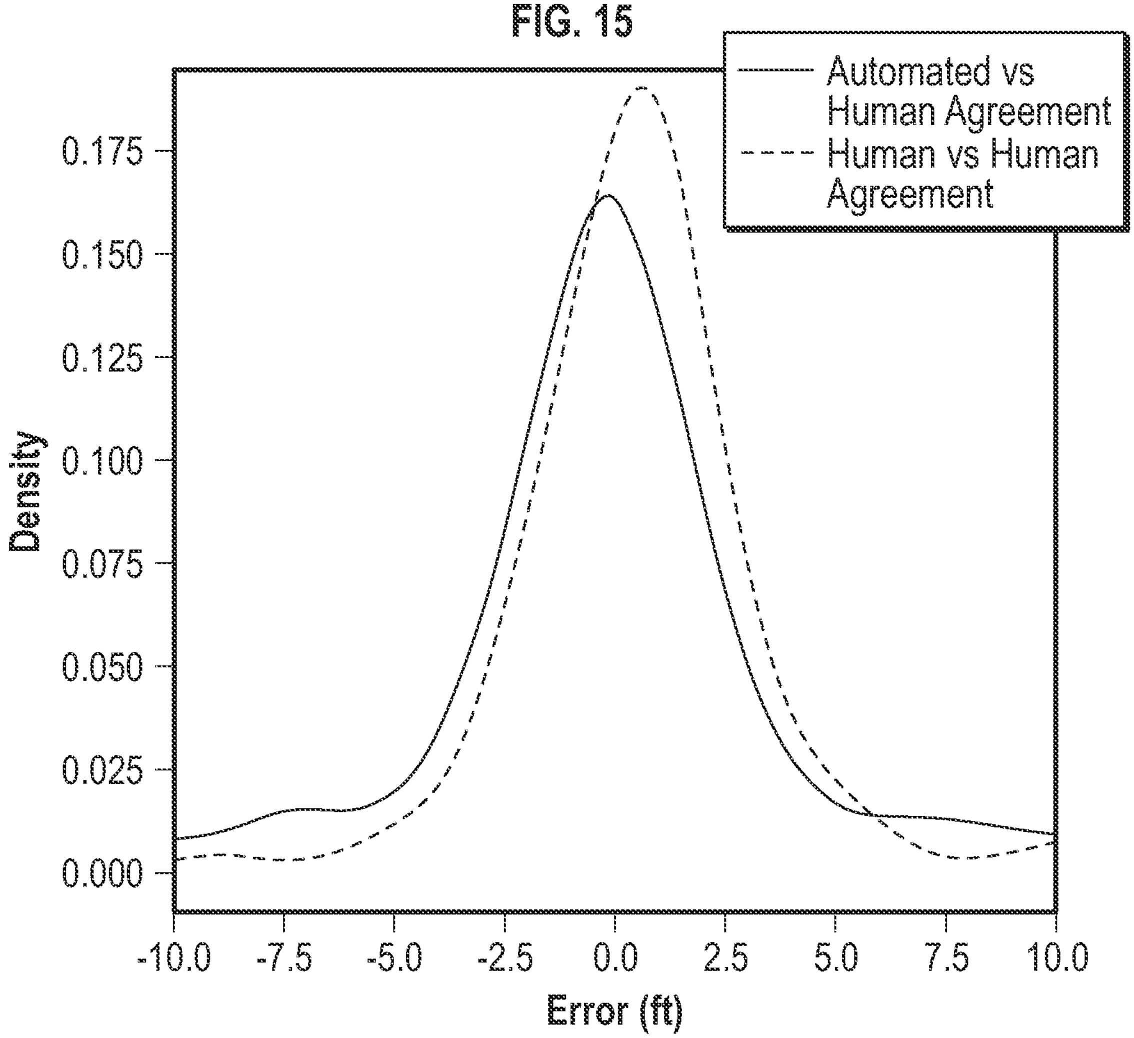
FIG. 16 is an exemplary graph of results of experimental usage of an exemplary modeling method in accordance with the present disclosure.
Figure 17:
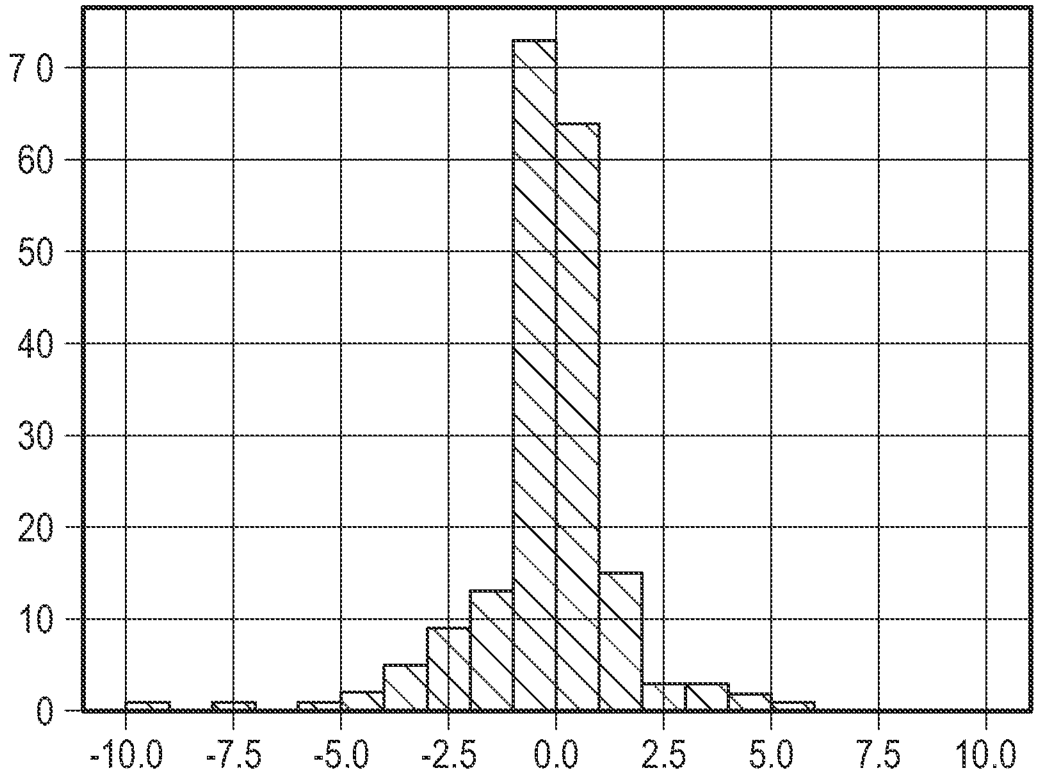
FIG. 17 is an exemplary graph of results of experimental usage of an exemplary modeling method in accordance with the present disclosure.

In experimental use, the method 100 has produced accurate and precise results as compared to manually-determined target elements 56 from target digital images. For example, FIG. 15 illustrates the results of experimental usage of the method 100 as a distribution of eave height uncertainty calculation relative to human manual assessment for approximately 1000 target structures 14 (uncertainty (feet) is shown on the x axis). Additionally, FIG. 16 illustrates human versus the method 100 automated agreement (solid line) and human versus human agreement (dotted line) on eave height determination from the target digital images 12. The results illustrated in FIG. 16 demonstrate that the automated and human techniques share consistency in uncertainty of the calculated height. Further, FIG. 17 illustrates the results of experimental usage of the method 100 showing a (predominant, e.g. largest) roof pitch comparison with manual human assessments for 500 target structures 14 (where uncertainty is plotted on the x axis relative to the pitch 'rise', where standard roof pitch is described as 'rise/run' of the roof structure and run is always 12 inches).

From the above description and examples, it is clear that the inventive concepts disclosed and claimed herein are well adapted to attain the advantages mentioned herein. The results of the method 100 may be used for a wide variety of real-world applications. Non-exclusive examples of such applications include use of the results to provide and/or complete inspections, to evaluate condition, to repair the structures 14, to create under-writing, to insure, to purchase, to construct, to value, or to otherwise impact the use of or the structure 14 itself.

For exemplary purposes, examples of digital images 12 of residential structures have been used. However, it is to be understood that the example is for illustrative purposes only and is not to be construed as limiting the scope of the invention. While exemplary embodiments of the inventive concepts have been described for purposes of this disclosure, it will be understood that numerous changes may be made which will readily suggest themselves to those skilled in the art and which are accomplished within the spirit of the inventive concepts disclosed and claimed herein.

The following is a number list of non-limiting illustrative embodiments of the inventive concept disclosed herein:

1. A computer system storing computer readable instructions that, when executed by the computer system, cause the computer system to perform the following:
receive target digital images depicting a target structure;
automatically identify target elements of the target structure in the target digital images using convolutional neural network semantic segmentation;
automatically generate a heat map model depicting a likelihood of a location of the target elements of the target structure based on results of the convolutional neural network semantic segmentation;
automatically generate a two-dimensional model or a three-dimensional model of the target structure based on the heat map model without further utilizing the target digital images; and
extract information regarding the target elements from the two-dimensional or the three-dimensional model of the target structure.

2. The computer system of claim 1, wherein the information regarding the target elements comprises one or more of: dimensions, areas, facets, feature characteristics, pitch, feature identification, feature type, element identification, element type, structural identification, and structural type.

3. The computer system of claim 1, wherein the target elements comprise one or more of a roof, a wall, a window, a door, or components thereof.

4. The computer system of claim 1, wherein generating the heat map model includes training the convolutional neural network utilizing example digital images and/or associated known feature data.

5. The computer system of claim 4, wherein the known feature data comprises one or more of: feature identification, feature type, element identification, element type, structural identification, structural type, and other structural information, regarding example structures depicted in the example digital images.

6. The computer system of claim 4, wherein the known feature data comprises one or more of: identification of a line as a ridge, identification of a line as an eave, identification of a line as a valley, identification of an area as a roof, identification of an area as a facet of a roof, identification of an area as a wall, identification of a feature as a window, identification of a feature as a door, identification of a relationship of lines as a roof, identification of a relationship of lines as a footprint of an example structure, identification of the example structure, identification of material types, identification of a feature as a chimney, identification of driveways, identification of sidewalks, identification of swimming pools, and identification of antennas.

7. The computer system of claim 1, wherein automatically generating the two-dimensional model or the three-dimensional model of the target structure based on the heat map model without further utilizing the target digital images, includes recognizing shapes created by lines of the heat map model.

8. The computer system of claim 1, wherein automatically generating the two-dimensional model or the three-dimensional model of the target structure based on the heat map model without further utilizing the target digital images further comprises: clarifying and vectorizing lines of the heat map model from a raster image of the heat map model.

9. The computer system of claim 1, further comprising: mapping lines from a raster image of the heat map model to a new viewpoint angle.

10. The computer system of claim 1, wherein one or more of the target digital images have associated geolocation information, and further comprising: mapping the heat map model mapped in the two-dimensional model and/or the three-dimensional model to a set of geolocated points based on the associated geolocation information.

11. The computer system of claim 1, wherein one or more of the target digital images have associated geolocation information, and further comprising: mapping lines, points, or features of the heat map model to additional target digital images based on the associated geolocation information.

12. The computer system of claim 1, wherein extracting information regarding the target elements from the two-dimensional or the three-dimensional model of the target structure includes extracting pitch of a roof of the target structure.

13. The computer system of claim 1, wherein portions of the heat map model are overlayed on one or more of the target digital images and/or on additional digital images.

14. A method, comprising:
receiving target digital images depicting a target structure;
automatically identifying target elements of the target structure in the target digital images using one or more machine learning model;
automatically generating a heat map model depicting a likelihood of a location of the target elements of the target structure based on results of the one or more machine learning model;
automatically generating a two-dimensional model or a three-dimensional model of the target structure based on the heat map model without further utilizing the target digital images; and
extracting information regarding the target elements from the two-dimensional or the three-dimensional model of the target structure.

15. The method of claim 14, wherein the one or more machine learning model includes convolutional neural network semantic segmentation.

What is claimed is:

1. A computer system storing computer readable instructions that, when executed by the computer system, cause the computer system to:

receive target digital images depicting a target structure;

automatically identify target elements of the target structure in the target digital images using a convolutional neural network to perform convolutional neural network semantic segmentation;

automatically generate a heat map model depicting a likelihood of a location of the target elements of the target structure based on results of the convolutional neural network semantic segmentation;

automatically generate a two-dimensional model and/or a three-dimensional model of the target structure based on the heat map model without further utilizing the target digital images by clarifying and vectorizing lines of the heat map model from a raster image of the heat map model; and extract information regarding the target elements from the two-dimensional model or the three-dimensional model of the target structure.

2. The computer system of claim 1, wherein the information regarding the target elements comprises one or more of: dimensions, areas, facets, feature characteristics, pitch, feature identification, feature type, element identification, element type, structural identification, and structural type.

3. The computer system of claim 1, wherein the target elements comprise one or more of a roof, a wall, a window, a door, or components thereof.

4. The computer system of claim 1, wherein generating the heat map model includes training the convolutional neural network utilizing one or more of: example digital images and associated known feature data.

5. The computer system of claim 4, wherein the known feature data comprises one or more of: feature identification, feature type, element identification, element type, structural identification, structural type, and other structural information, regarding example structures depicted in the example digital images.

6. The computer system of claim 4, wherein the lines of the heat map model are target lines, and the known feature data comprises one or more of: identification of an example line in the example digital images as a ridge, identification of an example line in the example digital images as an eave, identification of an example line in the example digital images as a valley, identification of an example area in the example digital images as a roof, identification of an example area in the example digital images as a facet of a roof, identification of an example area in the example digital images as a wall, identification of an example feature in the example digital images as a window, identification of an example feature in the example digital images as a door, identification of a relationship of example lines in the example digital images as a roof, identification of a relationship of example lines in the example digital images as a footprint of an example structure, identification of an example structure in the example digital images, identification of material types in the example digital images, identification of an example feature in the example digital images as a chimney, identification of driveways in the example digital images, identification of sidewalks in the example digital images, identification of swimming pools in the example digital images, and identification of antennas in the example digital images.

7. The computer system of claim 1, wherein automatically generating the two-dimensional model and/or the three-dimensional model of the target structure based on the heat map model without further utilizing the target digital images, includes recognizing shapes created by the lines of the heat map model.

8. The computer system of claim 1, further comprising: mapping the lines from the raster image of the heat map model to a new viewpoint angle.

9. The computer system of claim 1, wherein one or more of the target digital images have associated geolocation information, and further comprising: mapping the heat map model mapped in the two-dimensional model and/or the three-dimensional model to a set of geolocated points based on the associated geolocation information.

10. The computer system of claim 1, wherein one or more of the target digital images have associated geolocation information, and further comprising: mapping lines, points, or features of the heat map model to additional target digital images based on the associated geolocation information.

11. The computer system of claim 1, wherein extracting the information regarding the target elements from the two-dimensional model and/or the three-dimensional model of the target structure includes extracting pitch of a roof of the target structure.

12. The computer system of claim 1, wherein portions of the heat map model are overlayed on one or more of the target digital images and/or on additional digital images.

13. A method, comprising:

receiving, with one or more computer processors, target digital images depicting a target structure;

automatically identifying, with the one or more computer processors, target elements of the target structure in the target digital images using one or more machine learning models;

automatically generating, with the one or more computer processors, a heat map model depicting a likelihood of a location of the target elements of the target structure based on results of the one or more machine learning models;

automatically generating, with the one or more computer processors, a two-dimensional model and/or a three-dimensional model of the target structure based on the heat map model without further utilizing the target digital images by clarifying and vectorizing lines of the heat map model from a raster image of the heat map model; and extracting information regarding the target elements from the two-dimensional model and/or the three-dimensional model of the target structure.

14. The method of claim 13, wherein automatically identifying, with the one or more computer processors, the target elements of the target structure in the target digital images using the one or more machine learning models is further defined as automatically identifying, with the one or more computer processors, the target elements of the target structure in the target digital images using a convolutional neural network to perform convolutional neural network semantic segmentation.

15. The method of claim 13, wherein the information regarding the target elements comprises one or more of: dimensions, areas, facets, feature characteristics, pitch, feature identification, feature type, element identification, element type, structural identification, and structural type.

16. The method of claim 13, wherein the target elements comprise one or more of a roof, a wall, a window, a door, or components thereof.

17. The method of claim 13, further comprising: mapping, with the one or more computer processors, the lines from the raster image of the heat map model to a new viewpoint angle.

18. The method of claim 13, wherein one or more of the target digital images have associated geolocation information, and further comprising: mapping the heat map model mapped in the two-dimensional model and/or the three-dimensional model to a set of geolocated points based on the associated geolocation information.

19. The method of claim 13, wherein one or more of the target digital images have associated geolocation information, and further comprising: mapping lines, points, or features of the heat map model to additional target digital images based on the associated geolocation information.

* * * * *